(12) United States Patent
Ikura

(10) Patent No.: US 12,641,858 B2
(45) Date of Patent: May 26, 2026

(54) IGBT CELLS WITH FLOATING MESA

(71) Applicant: FUJI ELECTRIC CO., LTD.,
Kanagawa (JP)

(72) Inventor: Yoshihiro Ikura, Matsumoto-city (JP)

(73) Assignee: FUJI ELECTRIC CO., LTD.,
Kanagawa (JP)

( * ) Notice: Subject to any disclaimer, the term of this
patent is extended or adjusted under 35
U.S.C. 154(b) by 378 days.

(21) Appl. No.: 18/356,164

(22) Filed: Jul. 20, 2023

(65) Prior Publication Data

US 2024/0047541 A1 Feb. 8, 2024

(30) Foreign Application Priority Data

Aug. 3, 2022 (JP) ................................. 2022-124333
Dec. 14, 2022 (JP) ................................. 2022-199672

(51) Int. Cl.
*H10D 64/27* (2025.01)
*H10D 12/00* (2025.01)
*H10D 64/23* (2025.01)

(52) U.S. Cl.
CPC ......... *H10D 64/513* (2025.01); *H10D 12/481*
(2025.01); *H10D 64/231* (2025.01)

(58) Field of Classification Search
CPC ......... H10D 12/411–491; H10D 12/00; H10D 64/231; H10D 64/232; H10D 62/142;
H10D 62/145; H10D 64/513; H10D
12/481; H10D 62/127; H10D 64/519
See application file for complete search history.

(56) References Cited

U.S. PATENT DOCUMENTS

2018/0286943 A1* 10/2018 Naito .................... H10D 62/127
2020/0168727 A1* 5/2020 Beninger-Bina ..... H10D 12/038

FOREIGN PATENT DOCUMENTS

JP 2016184712 A 10/2016

* cited by examiner

*Primary Examiner* — Wasiul Haider

(57) ABSTRACT

Provided is a semiconductor device including a plurality of
mesa portions which are arranged one by one between two
of trench portions adjacent to each other in a second direc-
tion in a semiconductor substrate. The plurality of mesa
portions includes a floating mesa portion which is insulated
from an emitter electrode, and an emitter-connected mesa
portion which is arranged adjacent to the floating mesa
portion in the second direction and is connected to the
emitter electrode. At least one of the floating mesa portion
or the emitter-connected mesa portion is provided in a
portion provided at a position not overlapping the well
region in a top view to connect two of the trench portions
sandwiching the mesa portion, and has a separation portion
which separates the well region from at least a part of the
mesa portion.

21 Claims, 27 Drawing Sheets

IGBT CELLS WITH FLOATING MESA

The contents of the following patent application(s) are incorporated herein by reference:

NO. 2022-124333 filled in JP on Aug. 3, 2022
NO. 2022-199672 filed in JP on Dec. 14, 2022

BACKGROUND

1. Technical Field

The present invention relates to a semiconductor device.

2. Related Art

Conventionally, there has been known a semiconductor device in which a part of a mesa portion sandwiched between trench type gate electrodes is a floating mesa portion which is not connected to an emitter electrode (for example, see Patent Document 1).

Patent Document 1: Japanese Patent Application Publication No. 2016-184712

DESCRIPTION OF EXEMPLARY EMBODIMENTS

Figure 1:
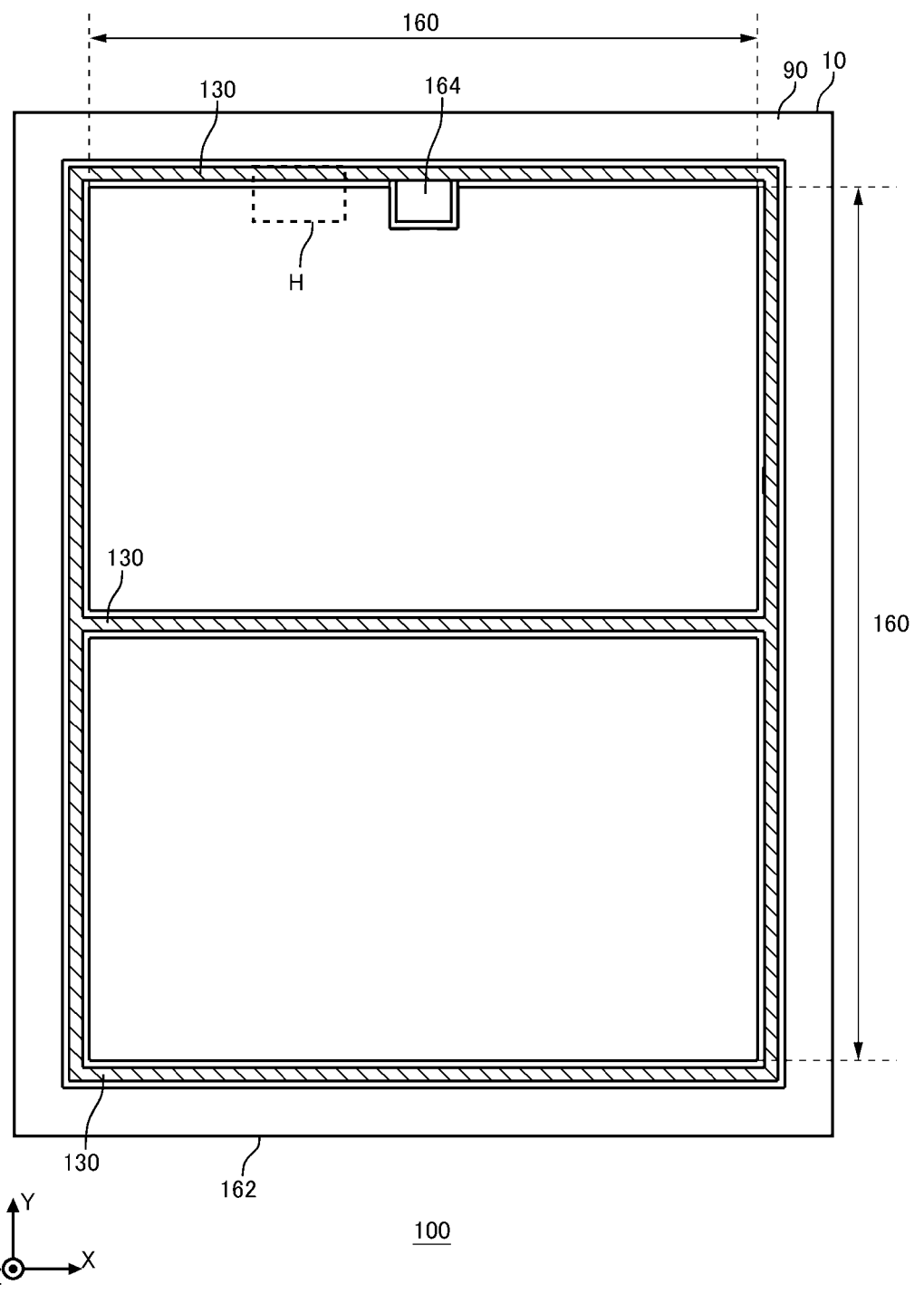
FIG. 1 is a top view illustrating an example of a semiconductor device 100 according to one embodiment of the present invention.

Hereinafter, the present invention will be described through embodiments of the invention, but the following embodiments do not limit the invention according to claims. In addition, not all of the combinations of features described in the embodiments are essential to the solution of the invention.

As used herein, one side in a direction parallel to a depth direction of a semiconductor substrate is referred to as "upper" and the other side is referred to as "lower". One of two main surfaces of a substrate, a layer, or other members is referred to as an "upper surface", and the other surface is referred to as a "lower surface". "Upper" and "lower" directions are not limited to a direction of gravity, or a direction in which a semiconductor device is mounted.

As used herein, technical matters may be described with orthogonal coordinate axes consisting of an X axis, a Y axis, and a Z axis. The orthogonal coordinate axes are merely for specifying relative positions of components, and are thus not for limiting to a specific direction. For example, the Z axis is not limited to represent a height direction with respect to the ground. Note that a +Z axis direction and a −Z axis direction are directions opposite to each other. When a direction is referred to as a "Z axis direction" without these "+" and "−" signs, it means the Z axis direction is parallel to +Z and −Z axes.

In the present specification, orthogonal axes parallel to an upper surface and lower surface of a semiconductor substrate are referred to as the X axis and the Y axis. Further, an axis perpendicular to the upper surface and the lower surface of the semiconductor substrate is referred to as the Z axis. As used herein, a direction of the Z axis may be referred to as a depth direction. Further, in the present specification, a direction parallel to the upper surface and the lower surface of the semiconductor substrate may be referred to as a horizontal direction, including the X axis direction and the Y axis direction.

A region from a center of the semiconductor substrate in the depth direction to the upper surface of the semiconductor substrate may be referred to as an upper surface side. Similarly, the region from the center of the semiconductor substrate in the depth direction to the lower surface of the semiconductor substrate may be referred to as a lower surface side.

As used herein, phrases such as "same" or "equal" may be used even when there is an error caused due to a variation in a fabrication step or the like. This error is within a range of 10% or less, for example.

In the present specification, a conductivity type of a doping region where doping has been carried out with an impurity is described as a P type or an N type. In the present specification, the impurity may particularly mean either a donor of the N type or an acceptor of the P type, and may be described as a dopant. In the present specification, doping means introducing the donor or the acceptor into the semiconductor substrate and turning it into a semiconductor showing a conductivity type of the N type, or a semiconductor showing a conductivity type of the P type.

A P+ type or an N+ type described in the present specification means a doping concentration higher than that of the P type or the N type, and a P− type or an N− type described herein means a doping concentration lower than that of the P type or the N type. Furthermore, a P++ type or an N++ type described in the present specification means a higher doping concentration than that of the P+ type or the N+ type.

FIG. 1 is a top view illustrating an example of a semiconductor device 100 according to one embodiment of the present invention. FIG. 1 illustrates a position at which each member is projected on an upper surface of a semiconductor substrate 10. In FIG. 1, only some members of the semiconductor device 100 are shown, and illustrations of some members are omitted.

The semiconductor device 100 includes the semiconductor substrate 10. The semiconductor substrate 10 is a substrate that is formed of a semiconductor material. As an example, the semiconductor substrate 10 is a silicon substrate. The semiconductor substrate 10 has an end side 162 in the top view. When merely referred to as the top view in the present specification, it means that the semiconductor substrate 10 is viewed from an upper surface side. The semiconductor substrate 10 of this example has two sets of end sides 162 opposite to each other in the top view. In FIG. 1, the X axis and the Y axis are parallel to any of the end sides 162. In addition, the Z axis is perpendicular to the upper surface of the semiconductor substrate 10.

The semiconductor substrate 10 is provided with an active portion 160. The active portion 160 is a region where a main current flows in the depth direction between the upper surface and the lower surface of the semiconductor substrate 10 when the semiconductor device 100 operates. An emitter electrode is provided above the active portion 160, but is omitted in FIG. 1. The active portion 160 may refer to a region that overlaps with the emitter electrode in the top view.

The active portion 160 is provided with a transistor element such as an insulated gate bipolar transistor (IGBT). The active portion 160 may be further provided with a diode element such as a freewheeling diode (FWD). The active portion 160 of this example is provided with an IGBT. The semiconductor device 100 may have a reverse conducting IGBT (RC-IGBT), a reverse blocking IGBT (RB-IGBT), or a MOSFET.

The semiconductor device 100 may have one or more pads above the semiconductor substrate 10. The semiconductor device 100 of this example has a gate pad 164. The semiconductor device 100 may have pads such as a pad connected to a diode element, a pad for temperature detection, and a pad for current detection. Each pad is arranged in a region close to the end side 162. The region close to the end side 162 refers to a region between the end side 162 and the emitter electrode in the top view. When the semiconductor device 100 is mounted, each pad may be connected to an external circuit via a wiring such as a wire.

A gate potential is applied to the gate pad 164. The gate pad 164 is electrically connected to a gate trench portion of the active portion 160. The semiconductor device 100 includes a gate runner 130 that connects the gate pad 164 and the gate trench portion. In FIG. 1, the gate runner 130 is hatched with diagonal lines. The gate runner 130 may include a metal wiring formed of a metal such as aluminum, may include a semiconductor runner formed of a semiconductor such as polysilicon doped with impurities, or may be a laminate of a metal wiring and a semiconductor runner.

The gate runner 130 of this example is arranged between the active portion 160 and the edge side 162 of the semiconductor substrate 10 in the top view. The gate runner 130 of this example surrounds the active portion 160 in a top view. In addition, a well region is formed below the gate runner. The well region is a region of the P type having a higher concentration than the base region described below, and is formed to a position deeper than the base region from the upper surface of the semiconductor substrate 10. The gate runner 130 may be provided to cross the active portion 160. The active portion 160 may be divided into a plurality of regions by the gate runner 130. In the example of FIG. 1, the gate runner 130 crosses substantially the center of the active portion 160 in the Y axis direction, and the active portion 160 is divided into two regions.

The semiconductor device 100 of this example includes an edge termination structure portion 90 between the active portion 160 and the end side 162 in the top view. The edge termination structure portion 90 of this example is arranged between the gate runner 130 and the end side 162. The edge termination structure portion 90 alleviates an electric field strength on the upper surface side of the semiconductor substrate 10. The edge termination structure portion 90 may be provided with at least one of a guard ring, a field plate, and a RESURF provided annularly to surround the active portion 160.

Figure 2:
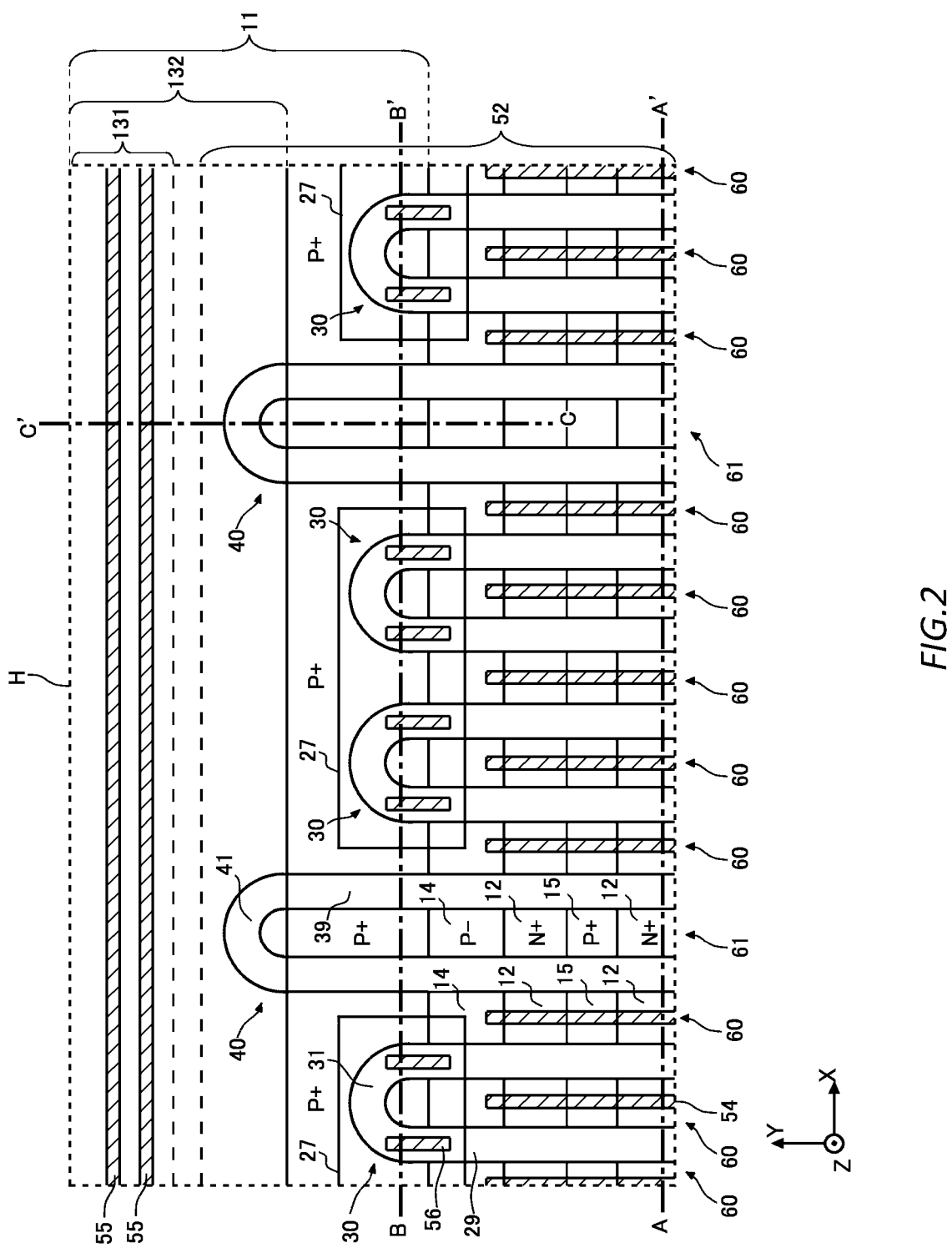
FIG. 2 is an enlarged view of a region H in FIG. 1.

FIG. 2 is an enlarged view of a region H in FIG. 1. FIG. 2 illustrates a structure of a semiconductor device of a comparative example. The region H is a region including the active portion 160 provided with a semiconductor element such as an IGBT and the gate runner 130. The semiconductor device 100 of this example includes a gate trench portion 40, a dummy trench portion 30, a well region 11, an emitter region 12, a base region 14, and a contact region 15, which are provided inside the semiconductor substrate 10 on the upper surface side. The gate trench portion 40 and the dummy trench portion 30 each are an example of the trench portion. A gate voltage is applied to the gate trench portion 40, and an emitter voltage is applied to the dummy trench portion 30. Each of the trench portions is provided from an upper surface 21 of the semiconductor substrate 10 to the inside of the semiconductor substrate 10. As illustrated in FIG. 2, each of the trench portions has a long side in the Y axis direction (first direction) on the upper surface 21 of the semiconductor substrate 10, and are arranged side by side in a second direction (X axis direction) different from the Y axis direction. In this example, the first direction and the second direction are orthogonal to each other, but the first direction and the second direction may not be orthogonal to each other.

The semiconductor device 100 of this example includes an emitter electrode 52, a first gate runner 131, and a second gate runner 132 provided above the upper surface of the semiconductor substrate 10. The first gate runner 131 and the second gate runner 132 are examples of the gate runner 130 illustrated in FIG. 1. The first gate runner 131 and the second gate runner 132 are laminated in the depth direction (Z axis direction).

The emitter electrode 52 and the gate runner 130 are electrically insulated. An interlayer dielectric film or the like is provided in a region where the emitter electrode 52 and the gate runner 130 overlap in the top view. An interlayer dielectric film is provided between the emitter electrode 52 and the gate runner 130, and the upper surface of the semiconductor substrate 10. In FIG. 2, the interlayer dielectric film is omitted.

The interlayer dielectric film is provided with contact holes 54, 55, and 56 for connecting conductive members provided above and below the interlayer dielectric film. In FIG. 2, each of the contact holes is hatched with diagonal lines. The contact hole 54 connects the emitter electrode 52 and the semiconductor substrate 10. The contact hole 55 connects the first gate runner 131 and the second gate runner 132. The contact hole 56 connects the emitter electrode 52 and the dummy trench portion 30.

The emitter electrode 52 is provided above the gate trench portion 40, the dummy trench portion 30, the well region 11, the emitter region 12, the base region 14, and the contact region 15. The emitter electrode 52 is in contact with the emitter region 12 and the contact region 15 on the upper surface of the semiconductor substrate 10 through the contact hole 54. The emitter electrode 52 may also be in contact with the base region 14 and the well region 11. The potentials of the base region 14 and the well region 11 of this example are emitter potentials at the emitter electrode 52.

The emitter electrode 52 is connected to a dummy conductive portion in the dummy trench portion 30 through the contact hole 56 provided in the interlayer dielectric film. A connection portion 27 formed of a conductive material such as polysilicon may be provided between the dummy trench portion 30 and the interlayer dielectric film. The connection portion 27 is connected with the dummy conductive portion of the dummy trench portion 30 and is connected with the emitter electrode 52 via the contact hole 56. The emitter electrode 52 may be connected to the dummy conductive portion of the dummy trench portion 30 in the vicinity of the edge of the dummy trench portion 30 in the Y axis direction.

The second gate runner 132 is connected to the gate conductive portion of the gate trench portion 40. The second gate runner 132 is arranged above the upper surface of the semiconductor substrate 10. A dielectric film such as an oxide film is provided between the second gate runner 132 and the semiconductor substrate 10. The gate trench portion 40 may be provided to extend in the Y axis direction up to a region overlapping the second gate runner 132. In a region where the gate trench portion 40 and the second gate runner 132 overlap, the gate trench portion 40 and the second gate runner 132 are connected via a contact hole provided in the above-described dielectric film. The second gate runner 132 is formed of a conductive material such as polysilicon. The second gate runner 132 may be formed of the same material as the gate conductive portion of the gate trench portion 40.

The first gate runner 131 is laminated on the second gate runner 132. The first gate runner 131 of this example is a metal wiring, and is arranged above the second gate runner 132. An interlayer dielectric film is provided between the first gate runner 131 and the second gate runner 132. The first gate runner 131 and the second gate runner 132 are connected via the contact hole 55 provided in the interlayer dielectric film. The first gate runner 131 may not overlap the gate trench portion 40.

The well region 11 is arranged in a region overlapping the gate runner 130 in the top view. The well region 11 may be arranged in a range wider than the gate runner 130 in the Y axis direction. The well region 11 may be arranged to overlap both the edges of a plurality of gate trench portions 40 in the Y axis direction and the edges of a plurality of dummy trench portions 30 in the Y axis direction. The well region 11 may be formed to be deeper than each trench portion. With such a configuration, the edge of each trench portion in the Y axis direction is surrounded by the well region of the P+ type. Therefore, it is possible to alleviate the electric field strength at the edge of each trench portion and improve a breakdown voltage.

The dummy trench portion 30 of this example is provided in a range not overlapping the second gate runner 132. The gate runner 130 is not connected to the dummy conductive portion in the dummy trench portion 30.

The emitter electrode 52 is formed of a material including metal. FIG. 2 shows a range where the emitter electrode 52 is provided. For example, at least partial region of the emitter electrode 52 is formed of aluminum or an aluminum-silicon alloy, for example, a metal alloy such as AlSi and AlSiCu. The emitter electrode 52 may have a barrier metal formed of titanium, a titanium compound, or the like below a region formed of aluminum or the like. Further, a plug, which is formed by embedding tungsten or the like so as to be in contact with the barrier metal and aluminum or the like, may be included in the contact hole.

The active portion 160 covered with the emitter electrode 52 has trench portions arranged side by side in the X axis direction. In the active portion 160 of this example, one or more gate trench portions 40 and one or more dummy trench portions 30 are alternately provided along the X axis direction.

The gate trench portion 40 of this example has two linear portions 39 (portions of a trench that are linear along the Y axis direction) extending along the Y axis direction perpendicular to the X axis direction, and an edge portion 41 connecting the two linear portions 39. In the present specification, one linear portion 39 may be treated as one gate trench portion 40.

At least a part of the edge portion 41 is preferably provided in a curved shape in the top view. By connecting end portions of the two linear portions 39 in the Y axis direction to each other by the edge portion 41, it is possible to alleviate an electric field strength at the end portions of the linear portions 39.

The dummy trench portion 30 of this example has two linear portions 29 extending along the Y axis direction and an edge portion 31 connecting the two linear portions 29. In the present specification, one linear portion 29 may be treated as one dummy trench portion 30.

At least a part of the edge portion 31 is preferably provided in a curved shape in the top view. By connecting end portions of the two linear portions 29 in the Y axis direction to each other by the edge portion 31, it is possible to alleviate an electric field strength at the end portions of the linear portion 29.

In the example of FIG. 2, two gate trench portions 40 (two linear portions 39) and four dummy trench portions 30 (four linear portions 29) are alternately arranged in the Y axis direction. In another example, a larger number of gate trench portions 40 may be continuously arranged in the Y axis direction, and a larger number of dummy trench portions 30 may be continuously arranged in the Y axis direction. In addition, the dummy trench portion 30 may not be provided in the active portion 160, and only the gate trench portion 40 may be arranged.

A mesa portion is provided between the respective trench portions in the X axis direction. The mesa portion refers to a region sandwiched between two trench portions adjacent to each other in the X axis direction inside the semiconductor substrate 10. The mesa portions are arranged one by one between two trench portions. As an example, an upper end of the mesa portion is the upper surface of the semiconductor substrate 10. The depth position of the lower end of the mesa portion is the same as the depth position of the lower end of the trench portion. The mesa portion of this example is provided to extend in the Y axis direction along the trench on the upper surface of the semiconductor substrate 10. In the present specification, the mesa portion connected to the emitter electrode 52 by the contact hole 54 is referred to as an emitter-connected mesa portion 60. In addition, a mesa portion which is not connected to the emitter electrode 52 by the contact hole 54 is referred to as a floating mesa portion 61. In the case of simply mentioning "mesa portion" in the present specification, the mesa portion refers to each of the emitter-connected mesa portion 60 and the floating mesa portion 61.

The upper surface of the floating mesa portion 61 is not in contact with the emitter electrode 52. In this example, one floating mesa portion 61 is provided to be sandwiched between two gate trench portions 40. The emitter-connected mesa portion 60 is arranged in a region sandwiched between the gate trench portion 40 and the dummy trench portion 30. In addition, the emitter-connected mesa portion 60 is also arranged in a region sandwiched between two dummy trench portions 30. By providing the floating mesa portion 61, a gate-collector capacitance can be increased, and a loss when the semiconductor device 100 is turned on can be reduced.

Each mesa portion is provided with the base region 14. The base region 14 may be provided in the entire mesa portion inside the semiconductor substrate 10. The base region 14 may or may not be exposed on the upper surface of the mesa portion. In the example of FIG. 2, the base region 14 is exposed between the well region 11 and the emitter region 12 on the upper surface of the semiconductor substrate 10.

Each mesa portion has the emitter region 12 in contact with (that is, exposed on the upper surface) the upper surface of the semiconductor substrate 10. At least a part of the emitter region 12 is provided in contact with the gate trench portion 40. Each mesa portion may have the contact region 15 exposed on the upper surface of the semiconductor substrate 10. The contact region 15 is a region of the P+ type having a higher concentration than the base region 14. By providing the contact region 15, a contact resistance with the emitter electrode 52 can be reduced.

Each of the contact region 15 and the emitter region 12 in the mesa portion of this example is provided from one trench portion to the other trench portion in the X axis direction. The contact regions 15 and the emitter regions 12 are alternately arranged along the Y axis direction.

In another example, the contact region 15 and the emitter region 12 of the mesa portion may be provided in a stripe shape along the Y axis direction. For example, the emitter region 12 is provided in a region in contact with each trench portion, and the contact region 15 is provided in a region sandwiched between the emitter regions 12.

The contact hole 54 is provided above each mesa portion. The contact hole 54 is arranged in a region sandwiched between two well regions 11 in the Y axis direction. The contact hole 54 of this example is provided above each region of the contact region 15, the base region 14, and the emitter region 12.

FIG. 2 illustrates a structure of the vicinity of one end portion of the trench portion in the Y axis direction. A similar structure may be provided in the vicinity of the other end portion of the trench portion. For example, the other end portion of the gate trench portion 40 is also connected to the second gate runner 132. In addition, the other end portion of each trench portion is also arranged in a region overlapping the well region 11.

Figure 3:
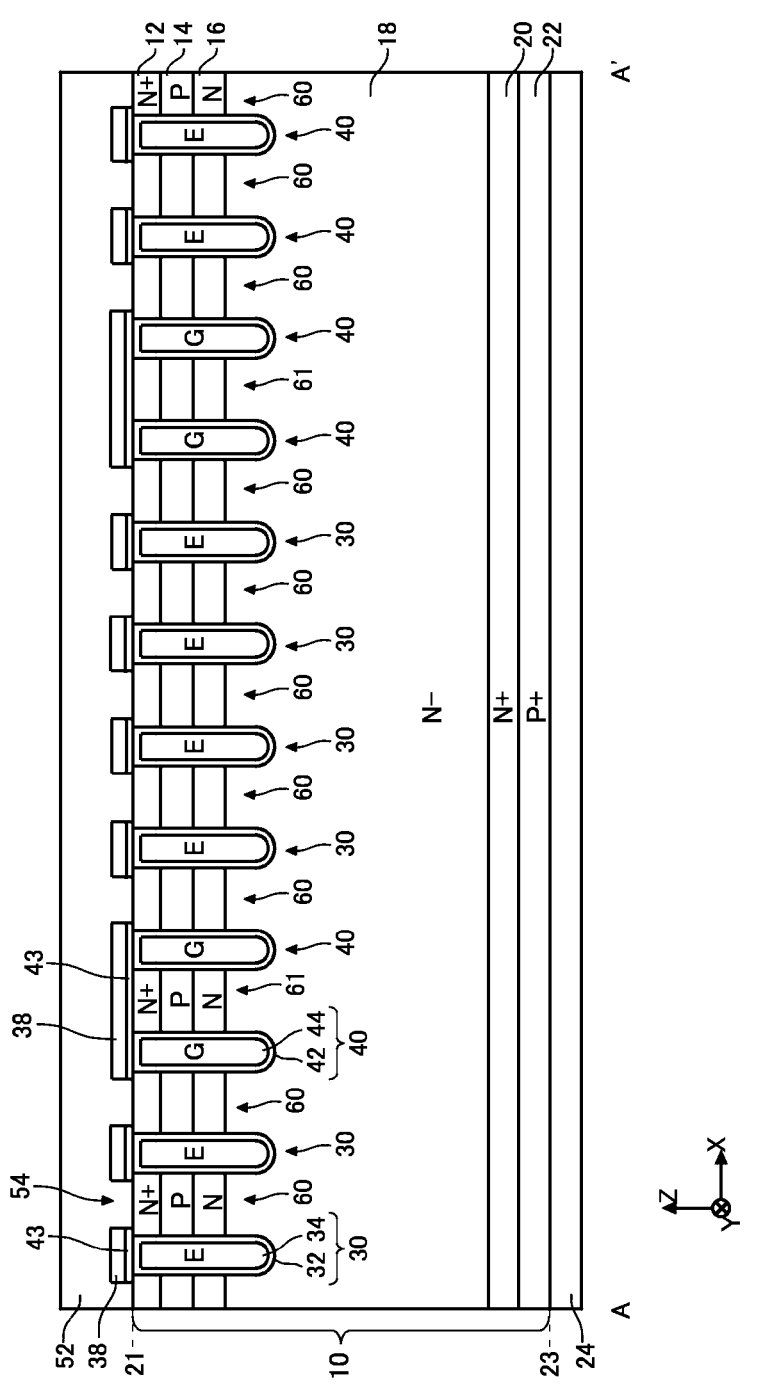
FIG. 3 is a view illustrating an example of an A-A' cross section in FIG. 2.

FIG. 3 is a view illustrating an example of an A-A' cross section in FIG. 2. The A-A' cross section is an XZ plane passing through the emitter region 12. The A-A' cross section includes the floating mesa portion 61 and the emitter-connected mesa portion 60. The semiconductor device 100 of this example includes the semiconductor substrate 10, an oxide film 43, an interlayer dielectric film 38, the emitter electrode 52, and a collector electrode 24 in the cross section.

The interlayer dielectric film 38 is provided on the upper surface of the semiconductor substrate 10. The interlayer dielectric film 38 is a film including at least one layer of a dielectric film such as silicate glass added with impurities of boron, phosphorus, or the like, a thermally oxidized film, or other dielectric films. The interlayer dielectric film 38 in the cross section is provided with the contact hole 54 described in FIG. 2.

The emitter electrode 52 is provided above the interlayer dielectric film 38. The emitter electrode 52 is in contact with an upper surface 21 of the semiconductor substrate 10 through the contact hole 54 of the interlayer dielectric film 38. The collector electrode 24 is provided on the lower surface 23 of the semiconductor substrate 10. The emitter electrode 52 and the collector electrode 24 are formed of a metal material such as aluminum. In the present specification, a direction in which the emitter electrode 52 is connected to the collector electrode 24 (the Z axis direction) is referred to as the depth direction.

The semiconductor substrate 10 includes a drift region 18 of the N− type. In each mesa portion (the emitter-connected mesa portion 60 and the floating mesa portion 61), the emitter region 12 of the N+ type and the base region 14 of the P type are provided in order from the upper surface 21 side of the semiconductor substrate 10. The drift region 18 is provided below the base region 14. The mesa portion may be provided with an accumulation region 16 of the N type. The accumulation region 16 is arranged between the base region 14 and the drift region 18. The accumulation region 16 is a region of the N type having a higher doping concentration than the drift region 18. By providing the accumulation region 16 having the high concentration between the drift region 18 and the base region 14, it is possible to improve a carrier injection enhancement effect (IE effect) and reduce an on-voltage. The accumulation region 16 may be provided to cover the entire lower surface of the base region 14 in each mesa portion.

The emitter region 12 is exposed on the upper surface 21 of the semiconductor substrate 10 and is provided in contact with the trench portion. The emitter region 12 has a higher doping concentration than the drift region 18.

The base region 14 is provided below the emitter region 12. The base region 14 of this example is provided in contact with the emitter region 12. The base region 14 may be in contact with the trench portions on both sides of the mesa portion.

A buffer region 20 of the N+ type may be provided below the drift region 18. The doping concentration of the buffer region 20 is higher than the doping concentration of the drift region 18. The buffer region 20 may have two or more concentration peaks in the depth direction (Z axis direction) of the semiconductor substrate 10. The buffer region 20 may serve as a field stop layer to prevent a depletion layer extending from the lower end of the base region 14 from reaching a collector region 22 of the P+ type.

In the semiconductor substrate 10, a collector region 22 of the P+ type is provided below the buffer region 20. An acceptor concentration of the collector region 22 is higher than an acceptor concentration of the base region 14. The collector region 22 is connected to the collector electrode 24. The collector electrode 24 is formed of a metal material such as aluminum.

One or more gate trench portions 40 and one or more dummy trench portions 30 are provided on the upper surface 21 side of the semiconductor substrate 10. In each drawing, the gate trench portion 40 may be denoted by a symbol G, and the dummy trench portion 30 may be denoted by a symbol E. Each trench portion passes through the base region 14 from the upper surface 21 of the semiconductor substrate 10, and is provided to below the base region 14. In a region where at least any one of the emitter region 12, the contact region 15, and the accumulation region 16 is provided, each trench portion also passes through the doping regions of these. The configuration of the trench portion penetrating the doping region is not limited to that fabricated in the order of forming the doping region and then forming the trench portion. The configuration of the trench portion penetrating the doping region also includes a configuration of the doping region being formed between the trench portions after forming the trench portion.

The gate trench portion 40 includes a gate dielectric film 42 and a gate conductive portion 44. The gate dielectric film 42 is provided to cover an inner wall of a trench provided from the upper surface 21 of the semiconductor substrate 10 to the inside of the semiconductor substrate 10. The gate dielectric film 42 may be formed by oxidizing or nitriding the semiconductor substrate 10 exposed on the inner wall of the trench. The gate conductive portion 44 is provided inside the gate dielectric film 42 in the trench. That is, the gate dielectric film 42 insulates the gate conductive portion 44 from the semiconductor substrate 10. The gate conductive portion 44 is formed of a conductive material such as polysilicon.

The gate conductive portion 44 may be provided longer than the base region 14 in the depth direction. The gate trench portion 40 in the cross section is covered by the interlayer dielectric film 38 on the upper surface 21 of the semiconductor substrate 10. The gate conductive portion 44 is electrically connected to the gate runner 130. When a predetermined gate voltage is applied to the gate conductive portion 44, a channel is formed by an electron inversion layer in a surface layer of the base region 14 at a boundary in contact with the gate trench portion 40.

The dummy trench portions 30 may have the same structure as the gate trench portions 40 in the cross section. The dummy trench portion 30 includes a dummy dielectric film 32 and a dummy conductive portion 34. The dummy conductive portion 34 is electrically connected to the emitter electrode 52. The dummy dielectric film 32 is provided to cover the inner wall of the trench. The dummy conductive portion 34 is provided in the trench and is provided inside the dummy dielectric film 32. The dummy dielectric film 32 insulates the dummy conductive portion 34 from the semiconductor substrate 10. The dummy conductive portion 34 may be formed of the same material as the gate conductive portion 44. For example, the dummy conductive portion 34 is formed of a conductive material such as polysilicon. The dummy conductive portion 34 may have the same length as the gate conductive portion 44 in the depth direction.

The gate trench portion 40 and the dummy trench portion 30 of this example are covered with the interlayer dielectric film 38 on the upper surface 21 of the semiconductor substrate 10. The emitter-connected mesa portion 60 is connected to the emitter electrode 52 by the contact hole 54 provided in the interlayer dielectric film 38. The floating mesa portion 61 is covered with the interlayer dielectric film 38. The floating mesa portion 61 is not connected to the emitter electrode 52. By providing the floating mesa portion 61, the gate-collector capacitance can be increased, and a turn-off loss can be reduced.

The oxide film 43 may be provided between the interlayer dielectric film 38 and the semiconductor substrate 10. The oxide film 43 may be formed in the same process as the gate dielectric film 42 and the dummy dielectric film 32, or may be formed in another process.

Figure 4:
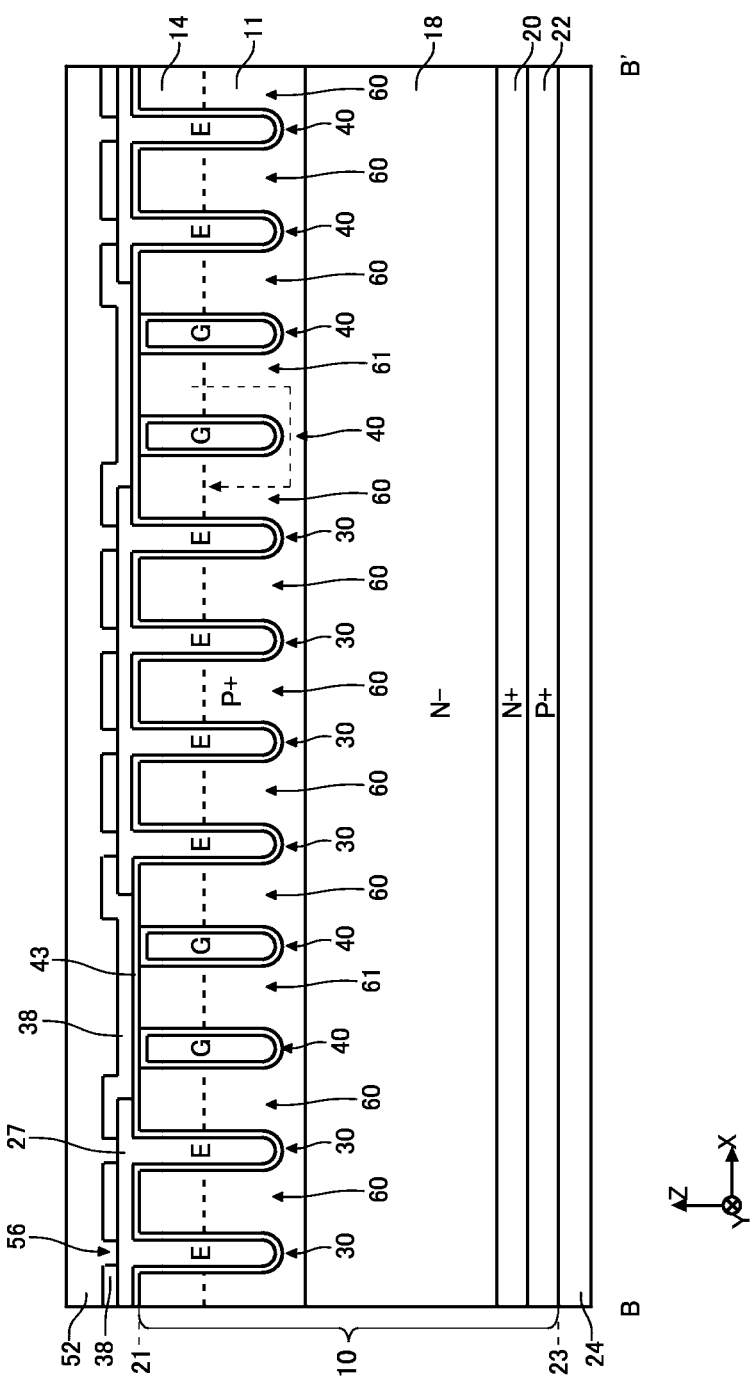
FIG. 4 is a view illustrating an example of a B-B' cross section in FIG. 2.

FIG. 4 is a view illustrating an example of a B-B' cross section in FIG. 2. The B-B' cross section is an XZ plane passing through the well region 11 and the contact hole 56. The B-B' cross section includes the floating mesa portion 61 and the emitter-connected mesa portion 60. The semiconductor device 100 of this example includes the semiconductor substrate 10, the oxide film 43, the interlayer dielectric film 38, the emitter electrode 52, and the collector electrode 24 in the cross section. Each dummy trench portion 30 is connected to the emitter electrode 52 via the connection portion 27 and the contact hole 56.

In the cross section, each trench portion (the dummy trench portion 30 and the gate trench portion 40) is surrounded by the well region 11. The well region 11 is provided between the drift region 18 and the upper surface 21 in the semiconductor substrate 10. The well region 11 is connected to the base region 14. In the present specification, when the base region 14 overlaps the well region 11 in the top view, the base region 14 may also be treated as a part of the well region 11.

In the cross section of FIG. 3, the base region 14 of the emitter-connected mesa portion 60 and the base region 14 of the floating mesa portion 61 are separated by a region of the N type (for example, the accumulation region 16 and the drift region 18). On the other hand, in the cross section of FIG. 4, as indicated by a broken line, the base region 14 of the emitter-connected mesa portion 60 and the base region 14 of the floating mesa portion 61 are connected by the well region 11. Therefore, the base region 14 of the floating mesa portion 61 may be connected to the emitter electrode 52 via the well region 11 and the emitter-connected mesa portion 60 not to be in a completely floating state with respect to the emitter electrode 52.

Figure 5:
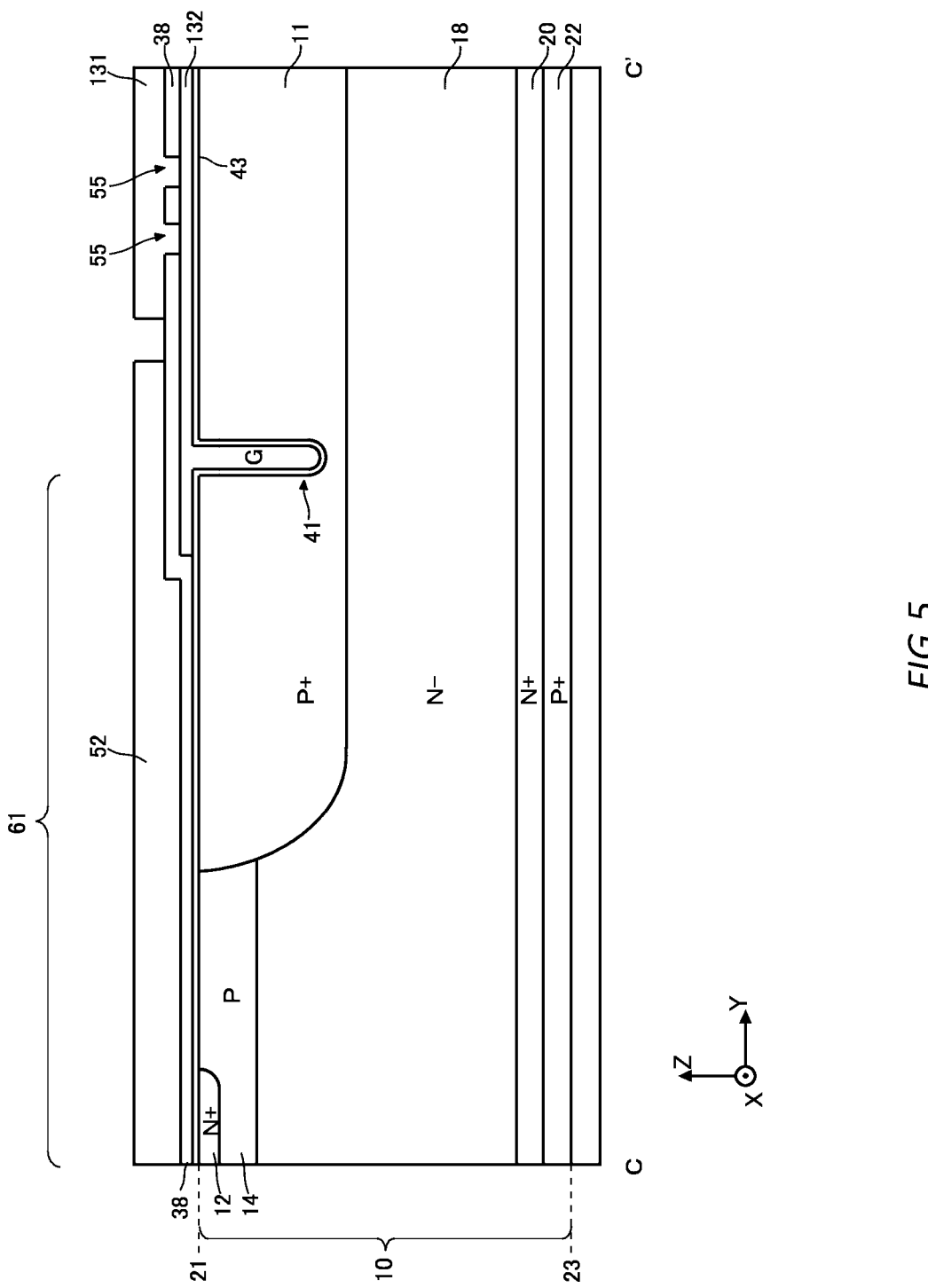
FIG. 5 is a view illustrating an example of a C-C' cross section in FIG. 2.

FIG. 5 is a view illustrating an example of a C-C' cross section in FIG. 2. The C-C' cross section is a YZ plane passing through the floating mesa portion 61. The C-C' cross-section includes the well region 11 and the edge portion 41 of the gate trench portion 40. The gate trench portion 40 is connected to the second gate runner 132. The second gate runner 132 is connected to the first gate runner 131 through the contact hole 55 illustrated in FIG. 2.

As illustrated in FIG. 5, the upper surface of the floating mesa portion 61 is insulated from the emitter electrode 52 by the interlayer dielectric film 38. However, as described in FIG. 4, the base region 14 of the floating mesa portion 61 and the emitter electrode 52 are connected via the well region 11 and the emitter-connected mesa portion 60. For this reason, the floating mesa portion 61 is not in a completely floating state, an increase in the gate-collector capacitance is suppressed, and the turn-on loss may not be sufficiently reduced.

Figure 6:
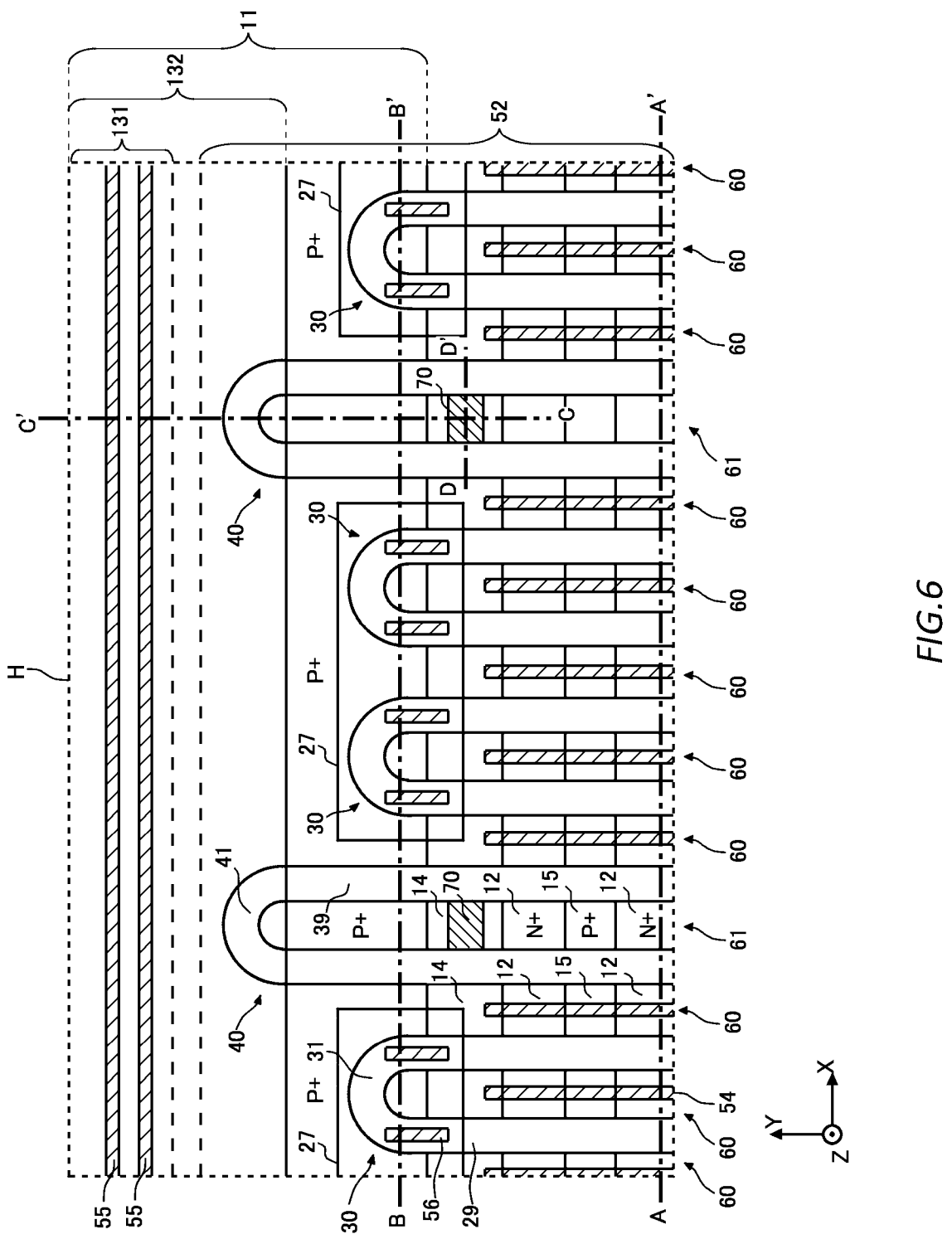
FIG. 6 is an enlarged view of the region H according to an example.

FIG. 6 illustrates an enlarged view of the region H according to an example. The semiconductor device 100 of this example further includes a connection trench portion 70 in addition to the structure described in FIGS. 1 to 5. The connection trench portion 70 is an example of a separation portion which is provided to connect two trench portions sandwiching a mesa portion and separates the well region 11 from at least a part of the mesa portion. The structure other than the connection trench portion 70 is the same as any of the aspects described in FIGS. 1 to 5.

The connection trench portion 70 is provided in at least one of the floating mesa portion 61 or the emitter-connected mesa portion 60 arranged adjacent to each other in the X axis direction. The mesa portions arranged adjacent to each other in the X axis direction refer to two mesa portions arranged adjacent to each other in the X axis direction with one trench portion (a linear portion of the trench portion in the example of FIG. 6) interposed therebetween. Although the connection trench portion 70 of this example is provided in the floating mesa portion 61, the connection trench portion 70 may be provided in the emitter-connected mesa portion 60 adjacent to the floating mesa portion 61, may be provided in both the floating mesa portion 61 and the emitter-connected mesa portion 60 adjacent to each other, or may be provided in all the mesa portions.

The connection trench portion 70 has a portion provided at a position not overlapping the well region 11 in the top view. The entire connection trench portion 70 of this example is arranged not to overlap the well region 11. In a more specific example, in the top view, the connection trench portion 70 is arranged between the emitter region 12 arranged at the most end in the Y axis direction in the mesa portion and the well region 11.

The connection trench portion 70 connects two trench portions sandwiching the mesa portion provided with the connection trench portion 70. The connection trench portion 70 may connect two trench portions having the same potential. The connection trench portion 70 of this example connects two gate trench portions 40 (two linear portions 39). The connection trench portion 70 may connect two dummy trench portions 30. By providing the connection trench portion 70 at a position not overlapping the well region 11, at least a part of the mesa portion and the well region 11 can be separated. Therefore, the region separated from the well region 11 in the mesa portion can be more reliably brought into a floating state with respect to the emitter electrode 52, and the gate-collector capacitance can be increased. Therefore, the turn-on loss can be reduced.

The connection trench portion 70 may have a portion not overlapping with the well region 11 and may be arranged as close as possible to the well region 11. As a result, in the mesa portion, the region separated from the well region 11 can be enlarged. As described above, the connection trench portion 70 may be provided between the emitter region 12 at the most end (that is, the outer side) in the Y axis direction and the well region 11, and may be provided between the contact region 15 at the most end (that is, the outer side) in the Y axis direction and the well region 11. The connection trench portion 70 may be in contact with the well region 11.

Figure 7:
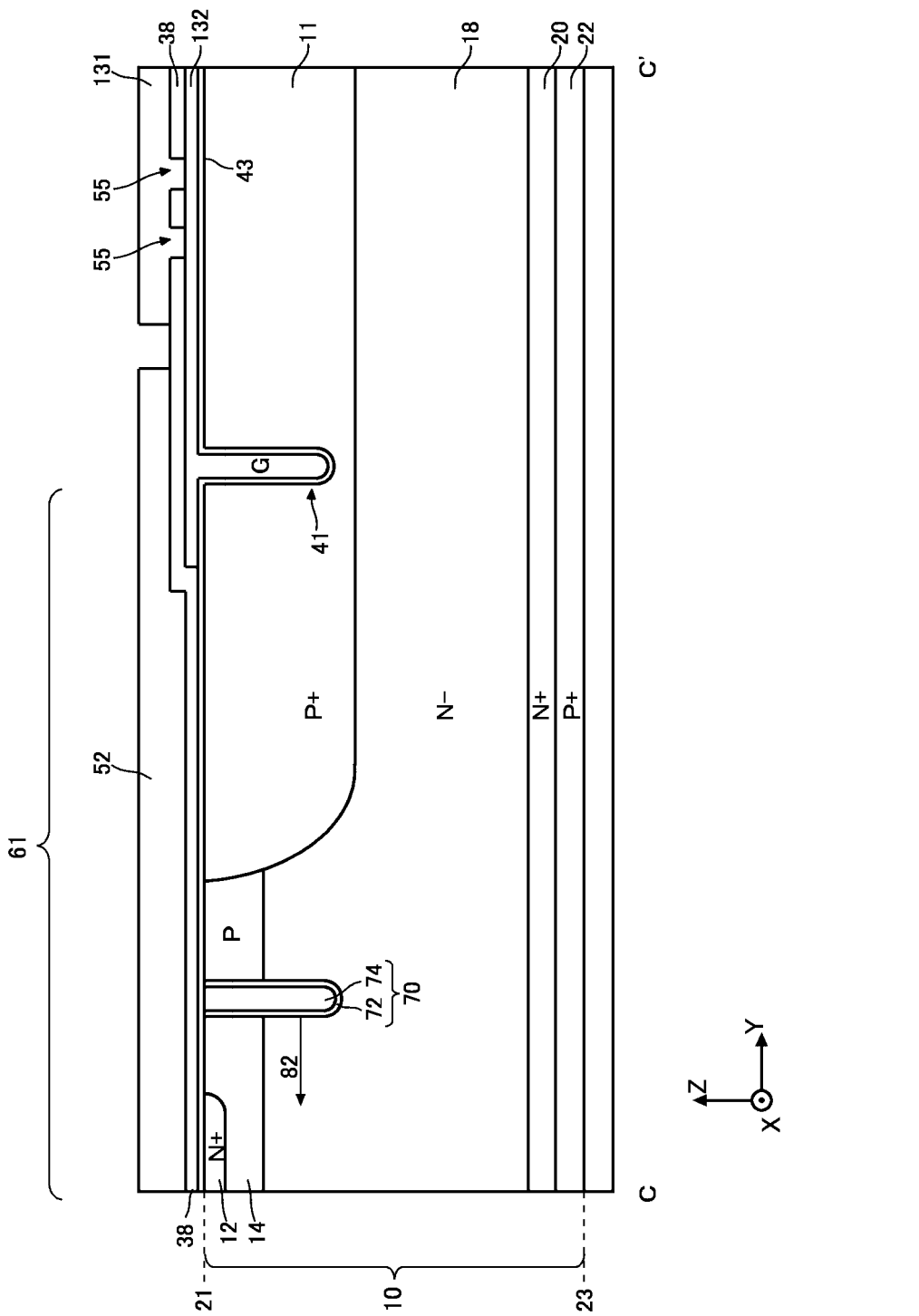
FIG. 7 is a view illustrating an example of a C-C' cross section in FIG. 6.

FIG. 7 is a view illustrating an example of a C-C' cross section in FIG. 6. The structure of the semiconductor device 100 of this example is the same as the structure described in FIG. 5 except that the connection trench portion 70 is provided. The connection trench portion 70 is insulated from the emitter electrode 52 by the interlayer dielectric film 38.

The well region 11 is provided from the upper surface 21 of the semiconductor substrate 10 to a position deeper than the lower end of the gate trench portion 40 (the edge portion 41 in FIG. 7). Therefore, with only the gate trench portion

40, the floating mesa portion 61 is connected to the emitter electrode 52 via the well region 11 and the emitter-connected mesa portion 60.

By providing the connection trench portion 70 at a position not overlapping the well region 11, at least partial region 82 of the floating mesa portion 61 can be separated from the well region 11. The region 82 is a region on a side opposite to the well region 11 with respect to the connection trench portion 70 in the floating mesa portion 61. Therefore, the region 82 can be more reliably brought into a floating state with respect to the emitter electrode 52.

The connection trench portion 70 may be formed from the upper surface 21 of the semiconductor substrate 10 to a position shallower than the lower end of the well region 11 or may be formed to a deeper position. The connection trench portion 70 may be formed to the same depth as the gate trench portion 40, or may be formed to be shallower than the gate trench portion 40. The connection trench portion 70 is preferably formed to be deeper than the base region 14. The connection trench portion 70 may be formed to be deeper than the accumulation region 16 illustrated in FIG. 3. The connection trench portion 70 may be formed to a depth reaching the drift region 18.

Similarly to the gate trench portion 40, the connection trench portion 70 may include a connection dielectric film 72 and a connection conductive portion 74. The connection dielectric film 72 is provided to cover the inner wall of the trench provided from the upper surface 21 of the semiconductor substrate 10 to the inside of the semiconductor substrate 10. The connection dielectric film 72 may be formed by oxidizing or nitriding the semiconductor substrate 10 exposed on the inner wall of the trench. The connection conductive portion 74 is provided inside the connection dielectric film 72 in the trench. That is, the connection dielectric film 72 insulates the connection conductive portion 74 from the semiconductor substrate 10. The connection conductive portion 74 is formed of a conductive material such as polysilicon. The connection trench portion 70 may be formed in the same process as the gate trench portion 40, or may be formed in another process.

Figure 8:
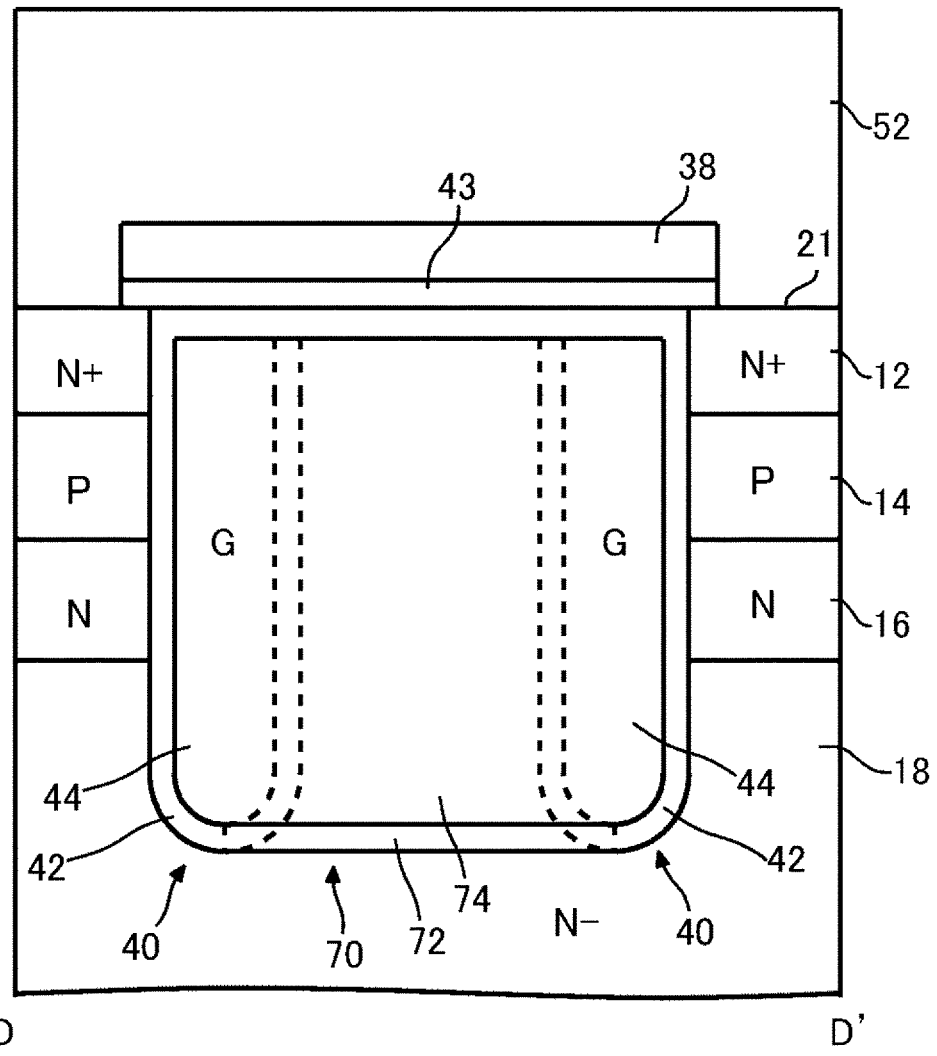
FIG. 8 is a view illustrating an example of a D-D' cross section in FIG. 6.
Figure 8:
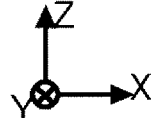

FIG. 8 is a view illustrating an example of a D-D' cross section in FIG. 6. The D-D' cross section is an XZ plane passing through the connection trench portion 70. The cross section includes two gate trench portions 40 and the connection trench portion 70. The connection trench portion 70 of this example is provided in the mesa portion (the floating mesa portion 61 in this example) sandwiched between the two gate trench portions 40.

The connection trench portion 70 connects two gate trench portions 40. The connection conductive portion 74 of the connection trench portion 70 may be connected to the gate conductive portions 44 of two gate trench portions 40. In FIG. 8, a region obtained by projecting the linear portion 39 of the gate trench portion 40 on the cross section is indicated by a broken line. The connection conductive portion 74 may be formed integrally with the gate conductive portion 44. The connection conductive portion 74 may be made of the same material and formed in the same process as the gate conductive portion 44. The connection trench portion 70 may be provided to the same depth as the gate trench portion 40.

According to the this example, the floating property of the floating mesa portion 61 can be improved by the connection trench portion 70, and the potentials of two gate trench portions 40 can be made uniform. In addition, by applying a gate voltage to the connection trench portion 70, a depletion layer in the vicinity of the lower end of the connection trench portion 70 can be expanded in a direction away from the connection trench portion 70. As a result, a breakdown voltage in the vicinity of the lower end of the connection trench portion 70 can be improved.

In another example, the inside of the connection trench portion 70 may be filled with a dielectric film. In addition, the connection conductive portion 74 of the connection trench portion 70 may be separated from the gate conductive portion 44. The floating property of the floating mesa portion 61 can also be improved in these cases.

Figure 9:
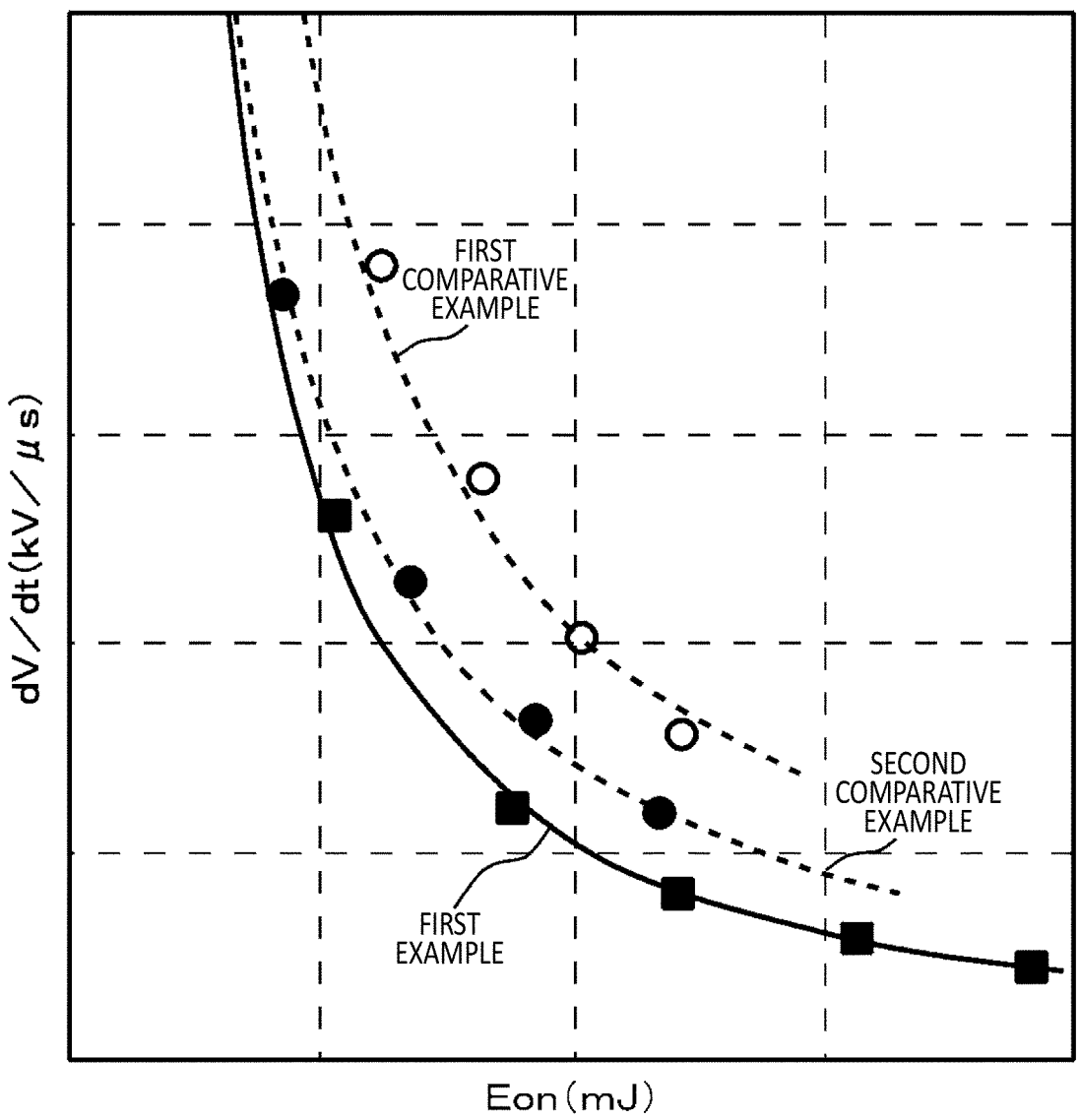
FIG. 9 is a view illustrating a relationship between a turn-on loss Eon of the semiconductor device 100 and a slope dV/dt of a voltage waveform.

FIG. 9 is a view illustrating a relationship between a turn-on loss Eon of the semiconductor device 100 and a slope dV/dt of a voltage waveform. The voltage waveform is a time waveform of a fall of an emitter-collector voltage Vce at the time of turn-on. The semiconductor device 100 of a second comparative example in FIG. 9 has the structure described in FIGS. 2 to 5. The semiconductor device 100 of a first comparative example has a structure in which the floating mesa portion 61 is connected to the emitter electrode 52 in the structure of the second comparative example. That is, the entire mesa portion of the first comparative example is the emitter-connected mesa portion 60. The semiconductor device 100 of a first example has the structure described in FIGS. 6 to 8.

As indicated by the characteristics of the second comparative example, by providing the floating mesa portion 61, the turn-on loss Eon can be reduced as compared with the first comparative example when the same dV/dt is set. In addition, by providing the connection trench portion 70 as in the first example, the floating property of the floating mesa portion 61 is improved, and the turn-on loss Eon can be further reduced.

Figure 10:
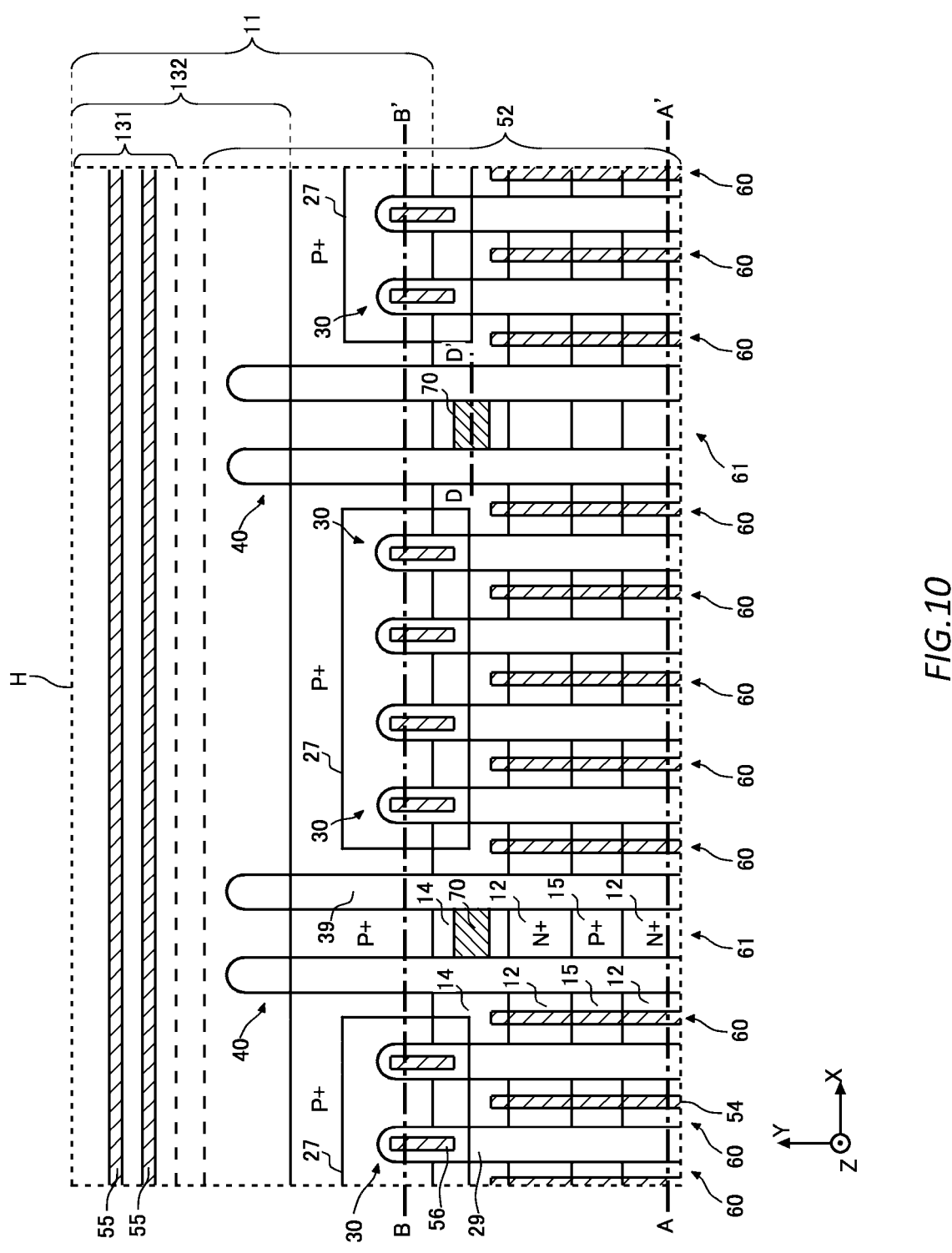
FIG. 10 is a view illustrating another structure example in the region H.

FIG. 10 is a view illustrating another structure example in the region H. The semiconductor device 100 of this example is different from the examples described in FIGS. 6 to 8 in the shapes of the gate trench portion 40 and the dummy trench portion 30. Other structures are similar to any of the examples described in FIGS. 6 to 8.

The gate trench portion 40 of this example does not have the edge portion 41. That is, the gate trench portion 40 of this example has only the linear portion 39. The dummy trench portion 30 of this example does not have the edge portion 31. That is, the dummy trench portion 30 of this example has only the linear portion 29. Even in such a structure, the floating property of the floating mesa portion 61 can be improved by providing the connection trench portion 70. In the example of FIG. 10, at least a part of the gate trench portion 40 and the dummy trench portion 30 may have an edge portion. That is, the trench portion having the edge portion and the trench portion not having the edge portion may be mixed.

Figure 11:
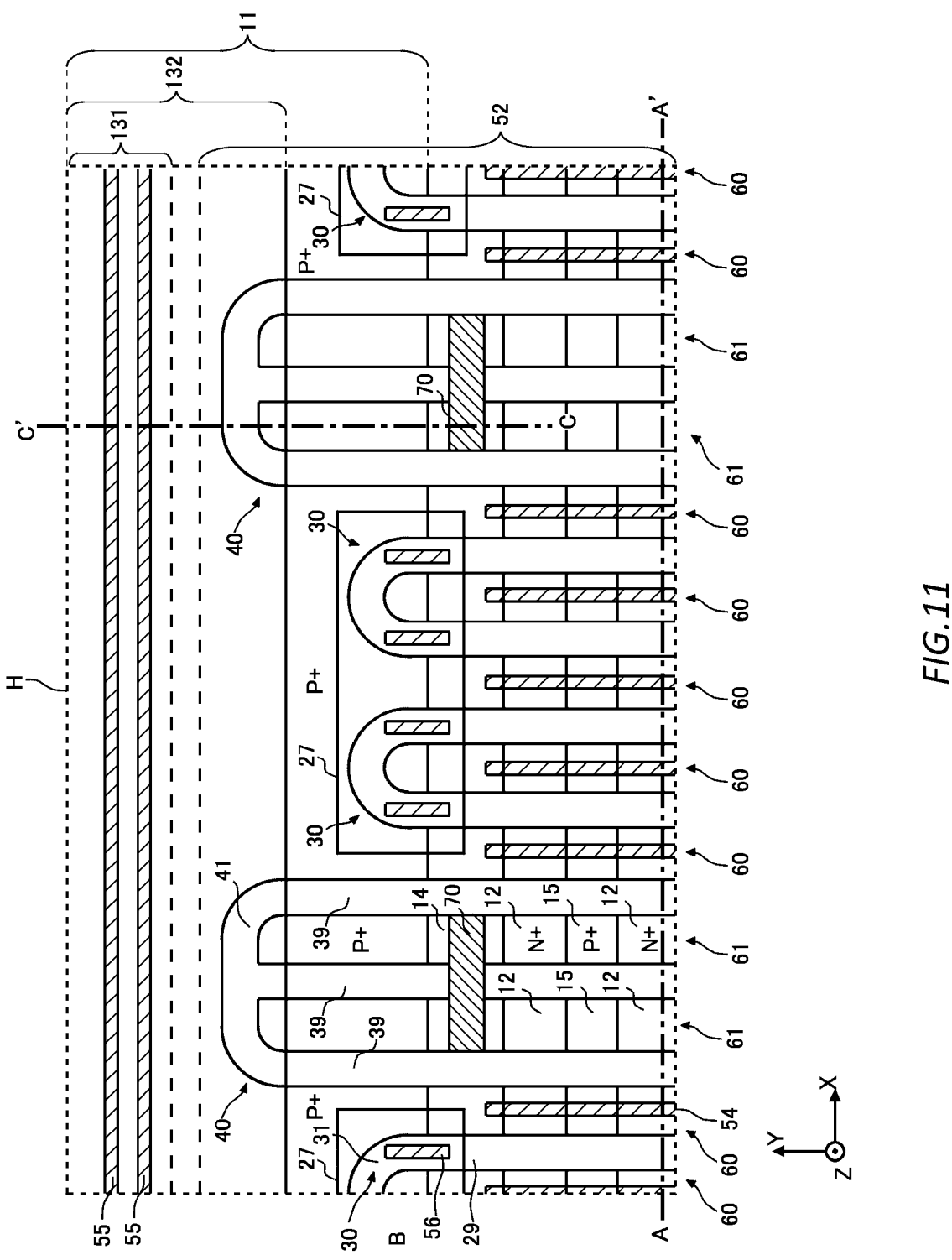
FIG. 11 is a view illustrating another structure example in the region H.

FIG. 11 is a view illustrating another structure example in the region H. The semiconductor device 100 of this example is different from the example described in FIGS. 6 to 10 in the structures of the connection trench portion 70 and the gate trench portion 40. Other structures are similar to any of the examples described in FIGS. 6 to 10.

In the semiconductor device 100 of this example, three or more gate trench portions 40 (or the linear portions 39 of the gate trench portions 40) are continuously arranged side by side in the X axis direction. As illustrated in FIG. 11, three or more linear portions 39 may be connected to each other by one edge portion 41. In addition, two or more floating mesa portions 61 are continuously arranged side by side in the X axis direction.

In this example, at least one connection trench portion 70 is connected to three or more gate trench portions 40 arranged in the X axis direction. The connection trench portion 70 is provided across two or more floating mesa portions 61. Also with such a configuration, the floating property of the floating mesa portion 61 can be improved.

Figure 12:
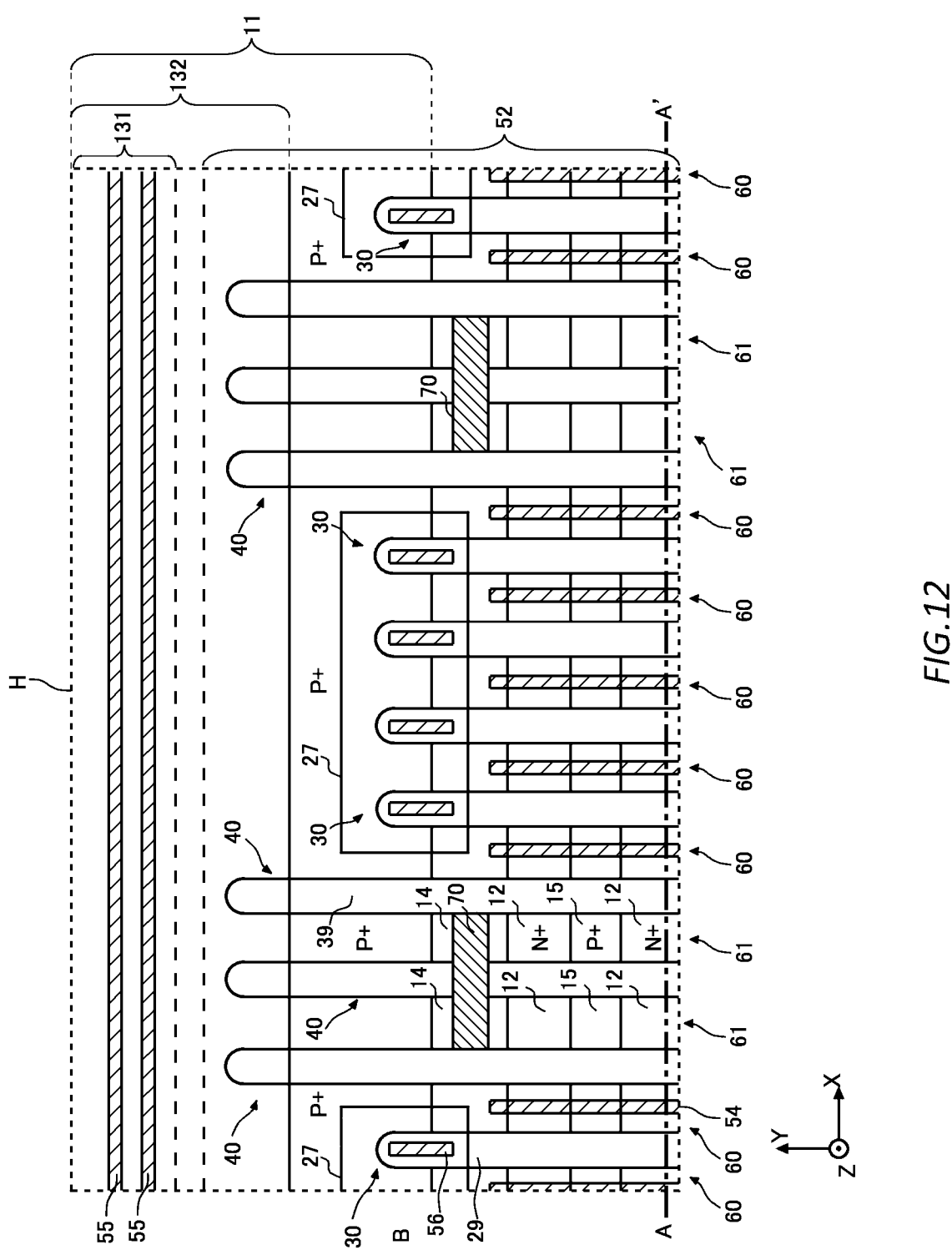
FIG. 12 is a view illustrating another structure example in the region H.

FIG. 12 is a view illustrating another structure example in the region H. The semiconductor device 100 of this example is different from the example described in FIG. 11 in the structures of the connection trench portion 70 and the gate trench portion 40. Other structures are similar to those of the example described in FIG. 11.

The gate trench portion 40 of this example does not have the edge portion 41. That is, the gate trench portion 40 of this example has only the linear portion 39. The dummy trench portion 30 of this example does not have the edge portion 31. That is, the dummy trench portion 30 of this example has only the linear portion 29. Even in such a structure, the floating property of the floating mesa portion 61 can be improved by providing the connection trench portion 70. In the example of FIG. 12, at least a part of the gate trench portion 40 and the dummy trench portion 30 may have an edge portion. That is, the trench portion having the edge portion and the trench portion not having the edge portion may be mixed.

Figure 13:
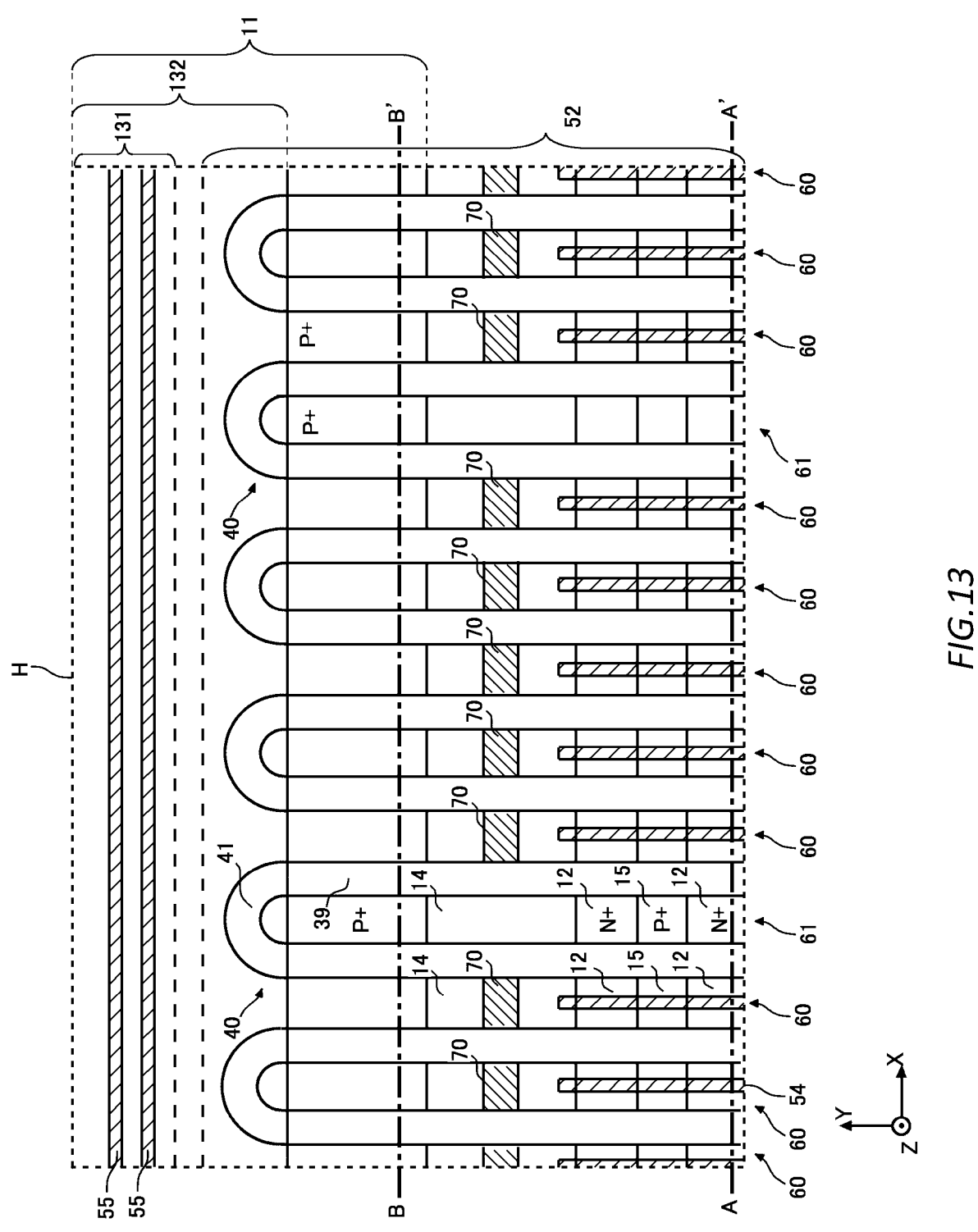
FIG. 13 is a view illustrating another structure example in the region H.

FIG. 13 is a view illustrating another structure example in the region H. In the examples of FIGS. 6 to 12, the connection trench portion 70 is provided in the floating mesa portion 61. In this example, the connection trench portion 70 is provided in the emitter-connected mesa portion 60 adjacent to the floating mesa portion 61 in the X axis direction. The connection trench portions 70 may be provided in all the emitter-connected mesa portions 60. The structure of the semiconductor device 100 other than that the connection trench portion 70 is provided in the emitter-connected mesa portion 60 is similar to the examples described in FIGS. 6 to 12. For example, the structure and the position in the Y axis direction of the connection trench portion 70 described in FIGS. 6 to 12 can also be applied to this example.

Also in this example, the connection trench portion 70 may connect two gate trench portions 40. In the this example, the emitter-connected mesa portion 60 provided with the connection trench portion 70 may be sandwiched between the two gate trench portions 40. All the mesa portions may be sandwiched between two gate trench portions 40.

Even when the connection trench portion 70 is provided in the emitter-connected mesa portion 60, the emitter-connected mesa portion 60 and the floating mesa portion 61 can be separated, and the floating property of the floating mesa portion 61 can be improved. In addition, by providing the connection trench portions 70 in all the emitter-connected mesa portions 60, the floating property of the floating mesa portion 61 can be further improved. In addition, the connection trench portions 70 may be provided in all the mesa portions.

Figure 14:
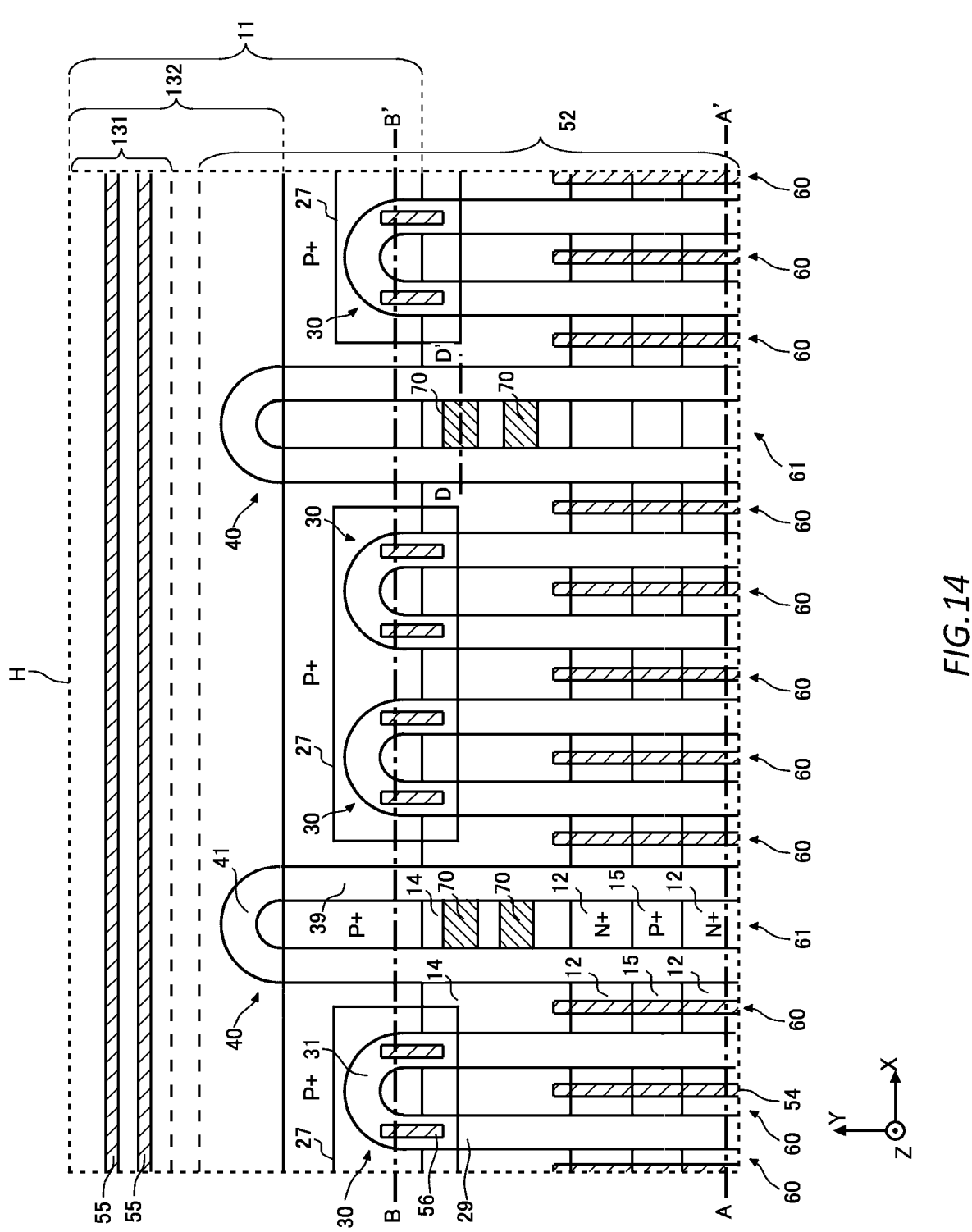
FIG. 14 is a view illustrating another structure example in the region H.

FIG. 14 is a view illustrating another structure example in the region H. In the examples of FIGS. 6 to 13, in one mesa portion, one connection trench portion 70 is arranged between the emitter region 12 arranged at the most end in the Y axis direction and the well region 11. In this example, a plurality of connection trench portions 70 are arranged between the emitter region 12 arranged at the most end in the Y axis direction and the well region 11. The plurality of connection trench portions 70 are arranged side by side in the Y axis direction.

The plurality of connection trench portions 70 arranged in the Y axis direction may have the same structure and shape. The plurality of connection trench portions 70 may be formed to the same depth. In another example, the plurality of connection trench portions 70 arranged in the Y axis direction may be formed at different depths. For example, the closer to the well region 11, the deeper the connection trench portion 70 may be formed. According to this example, the floating property of the floating mesa portion 61 can be further improved.

Figure 15:
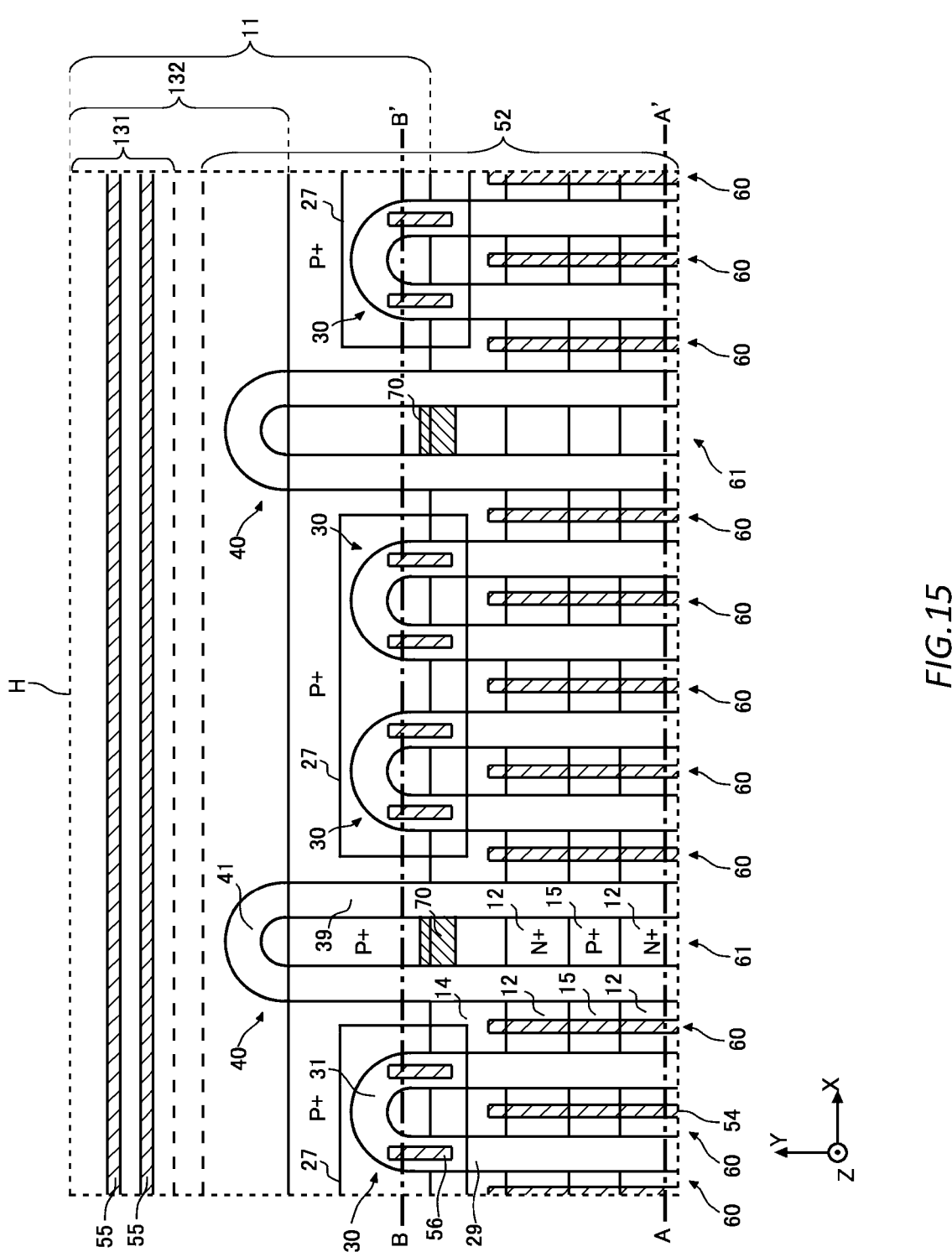
FIG. 15 is a view illustrating another structure example in the region H.

FIG. 15 is a view illustrating another structure example in the region H. In the examples of FIGS. 6 to 14, the connection trench portion 70 is arranged away from the well region 11. In this example, at least one connection trench portion 70 is arranged in contact with the well region 11. The connection trench portion 70 may have a portion overlapping the well region 11 in the top view. The structure other than the arrangement of the connection trench portions 70 is similar to any of the examples described in FIGS. 6 to 14. However, the connection trench portion 70 has a portion not overlapping the well region 11. Since the connection trench portion 70 has a portion not overlapping the well region 11, the well region 11 and the floating mesa portion 61 can be separated from each other, and the floating property of the floating mesa portion 61 can be improved.

Figure 16:
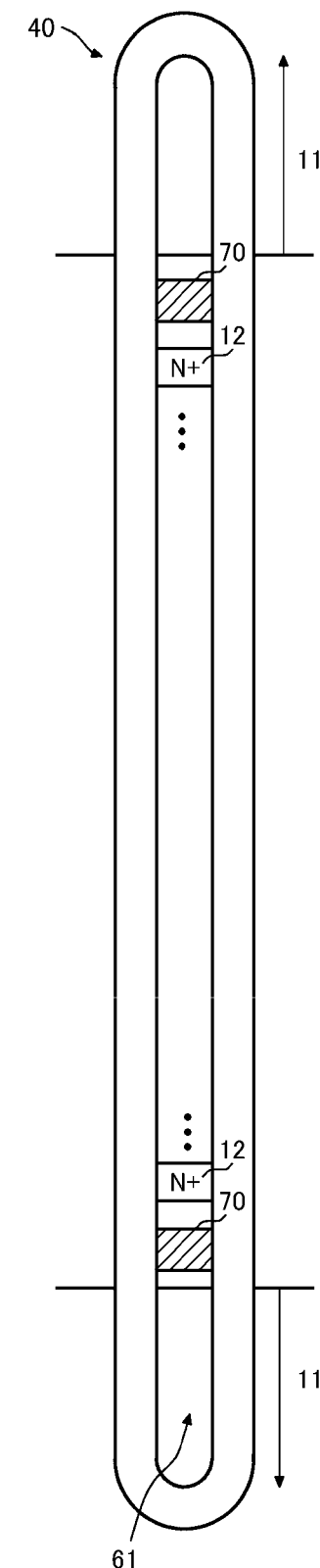
FIG. 16 is a view illustrating an arrangement example of connection trench portions 70.

FIG. 16 is a view illustrating an arrangement example of the connection trench portions 70. The structure other than the arrangement of the connection trench portions 70 is similar to those of the examples of FIGS. 6 to 15. In the examples of FIGS. 6 to 15, a structure in the vicinity of one end portion of the mesa portion in the Y axis direction is illustrated. As described above, the structure described with reference to FIGS. 6 to 15 may be provided in the vicinity of both ends of the mesa portion in the Y axis direction.

The floating mesa portion 61 of this example is provided between two well regions 11 in the Y axis direction. The connection trench portions 70 may be arranged with respect to the respective well regions 11. For example, the connection trench portion 70 may be arranged between each well region 11 and the emitter region 12 arranged at the most end in the Y axis direction.

Figure 17:
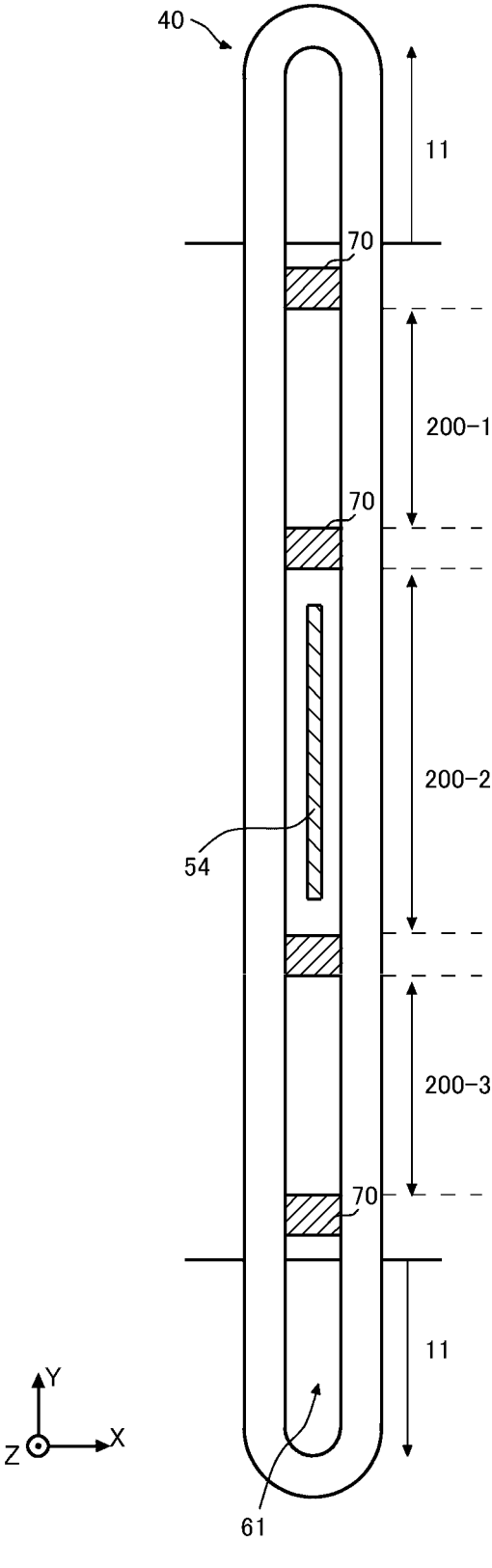
FIG. 17 is a view illustrating another arrangement example of the connection trench portions 70.

FIG. 17 is a view illustrating another arrangement example of the connection trench portions 70. The structure other than the arrangement of the connection trench portions 70 may be similar to those of the examples of FIGS. 6 to 16. In the floating mesa portion 61 of this example, two or more connection trench portions 70 are arranged at different positions in the Y axis direction. The number of the connection trench portions 70 may be three or more, or may be four or more. The floating mesa portion 61 is divided into two or more partial regions 200 by the connection trench portion 70. The floating mesa portion 61 may be divided into three or more partial regions 200. Each partial region 200 may include one or more emitter regions 12. Each partial region 200 may include one or more contact regions 15.

Any of the partial regions 200 may be connected to the emitter electrode 52, and any other of the partial regions 200 may not be connected to the emitter electrode 52. In the example of FIG. 17, a partial region 200-1 and a partial region 200-3 are floating regions that are not connected to the emitter electrode 52. In addition, a partial region 200-2 is connected to the emitter electrode 52 via the contact hole 54. The partial region 200-2 is sandwiched between the partial region 200-1 and the partial region 200-3 in the Y axis direction. The partial region 200-1 and the well region 11 are separated by one or more connection trench portions 70. In addition, the partial region 200-3 and the well region 11 are separated by one or more connection trench portions 70.

With such a structure, in the floating mesa portion 61, the partial region 200 connected to the emitter electrode 52 and the partial region 200 not connected to the emitter electrode 52 can be provided. As a result, a region which functions as a transistor can be provided in the floating mesa portion 61, and more various designs can be made.

Figure 18:
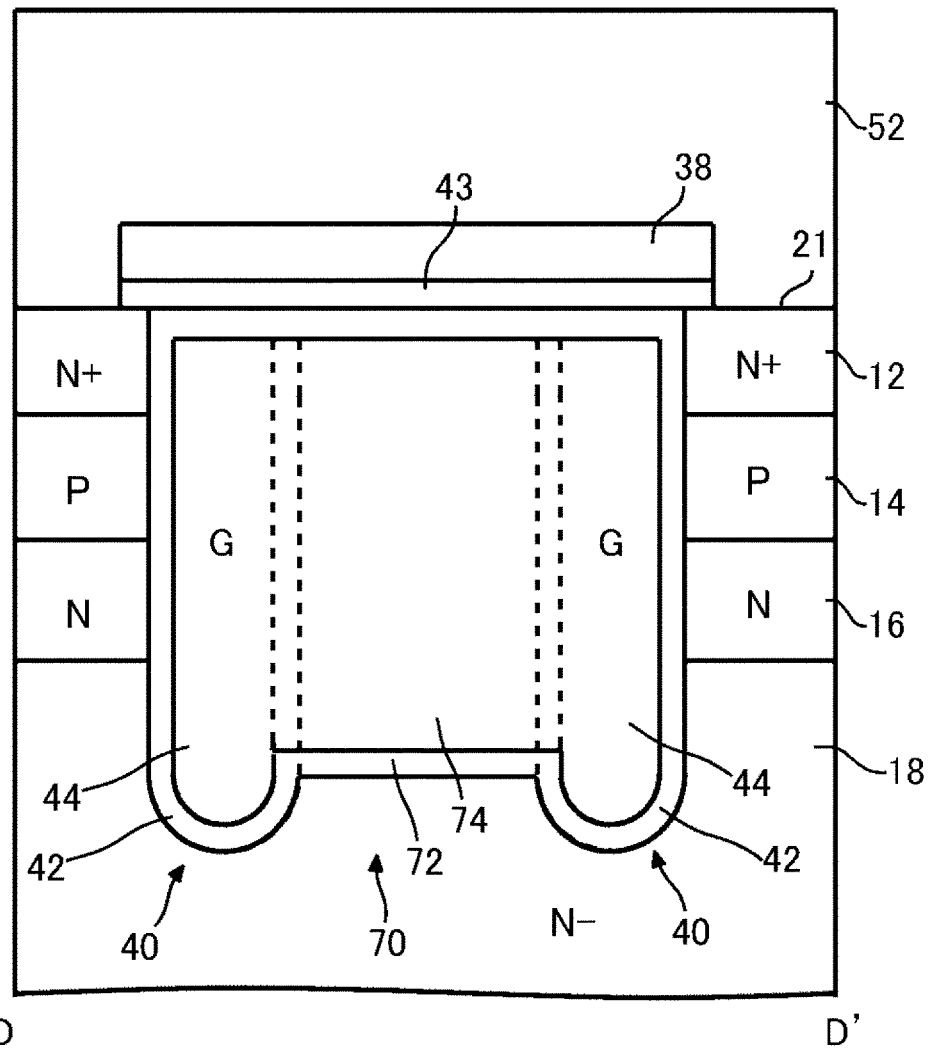
FIG. 18 is a view illustrating another structure example of the connection trench portion 70.
Figure 18:
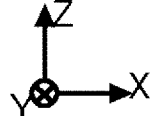

FIG. 18 is a view illustrating another structure example of the connection trench portion 70. The connection trench portion 70 of this example is different from those of the examples described in FIGS. 6 to 17 in that the connection trench portion is provided to be shallower than the gate trench portion 40 or the dummy trench portion 30. Other structures are similar to any of the examples described in FIGS. 6 to 17.

When the connection trench portion 70 is formed to be deep, an electric field may concentrate at the lower end of the connection trench portion 70. By forming the connection trench portion 70 shallow, it is possible to alleviate an electric field strength on the lower end of the connection trench portion 70. The connection trench portion 70 is preferably formed to be deeper than the base region 14.

The width of the connection trench portion 70 in the Y axis direction may be the same as the width of the linear portion of the gate trench portion 40 or the dummy trench portion 30 in the X axis direction, and may be smaller than the width of the linear portion of the gate trench portion 40 or the dummy trench portion 30 in the X axis direction. The width of the connection trench portion 70 in the Y axis direction may be larger than the width of the linear portion of the gate trench portion 40 or the dummy trench portion 30 in the X axis direction.

Figure 19:
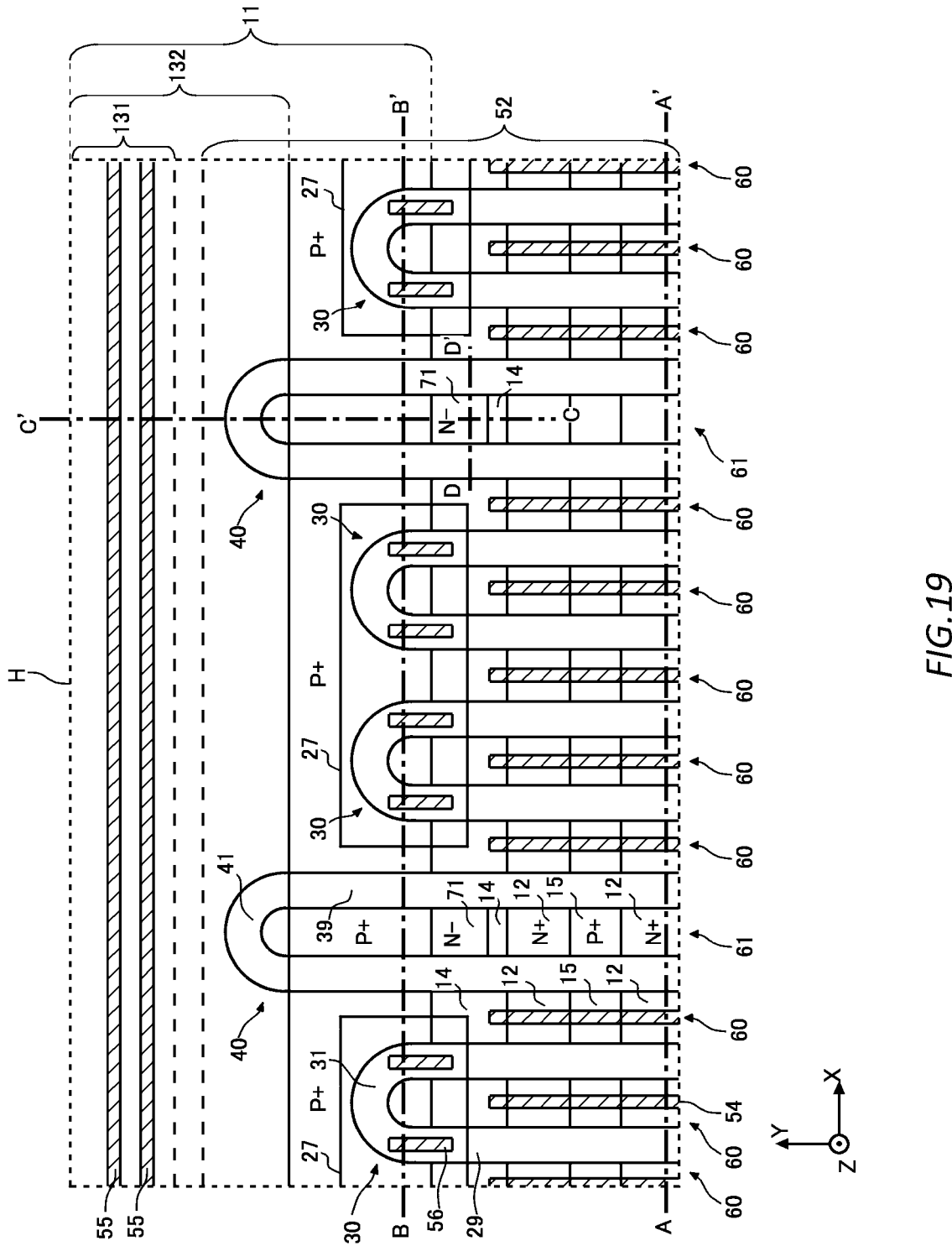
FIG. 19 is a view illustrating another example of the region H.

FIG. 19 is a view illustrating another example of the region H. The semiconductor device 100 of this example includes a first region 71 instead of the connection trench portion 70. The structure other than the first region 71 is the same as any of the aspects described in FIGS. 1 to 18. The first region 71 is an example of the separation portion which is provided to connect two trench portions sandwiching a mesa portion and separates the well region 11 from at least a part of the mesa portion.

The first region 71 is a region of the first conductivity type (N− type in this example) provided between the well region 11 and at least a part of the base region 14 to separate the well region 11 from at least a part of the base region 14. The position of the first region 71 in the top view is similar to that of the connection trench portion 70. The first region 71 is provided at the same depth as the base region 14 or deeper than the base region 14 in the Z axis direction. With such a configuration, the base region 14 and the well region 11 are separated.

The first region 71 may have a lower doping concentration than that of the emitter region 12. In addition, in another mesa portion where the first region 71 is not provided, a region of the P type (for example, the base region 14) may be arranged at the same Y axis position as the first region 71. The first region 71 may be arranged between the emitter region 12 arranged closest to the well region 11 and the well region 11 in the mesa portion.

The first region 71 has a portion provided at a position not overlapping the well region 11 in the top view. The first region 71 of this example is arranged not to entirely overlap the well region 11. The first region 71 may be in contact with the well region 11 or may be arranged apart from the well region. By arranging the first region 71 and the well region 11 in contact with each other, a region separated from the well region 11 can be enlarged in the mesa portion. The floating property of the floating mesa portion 61 can be improved by providing the first region 71.

Figure 20:
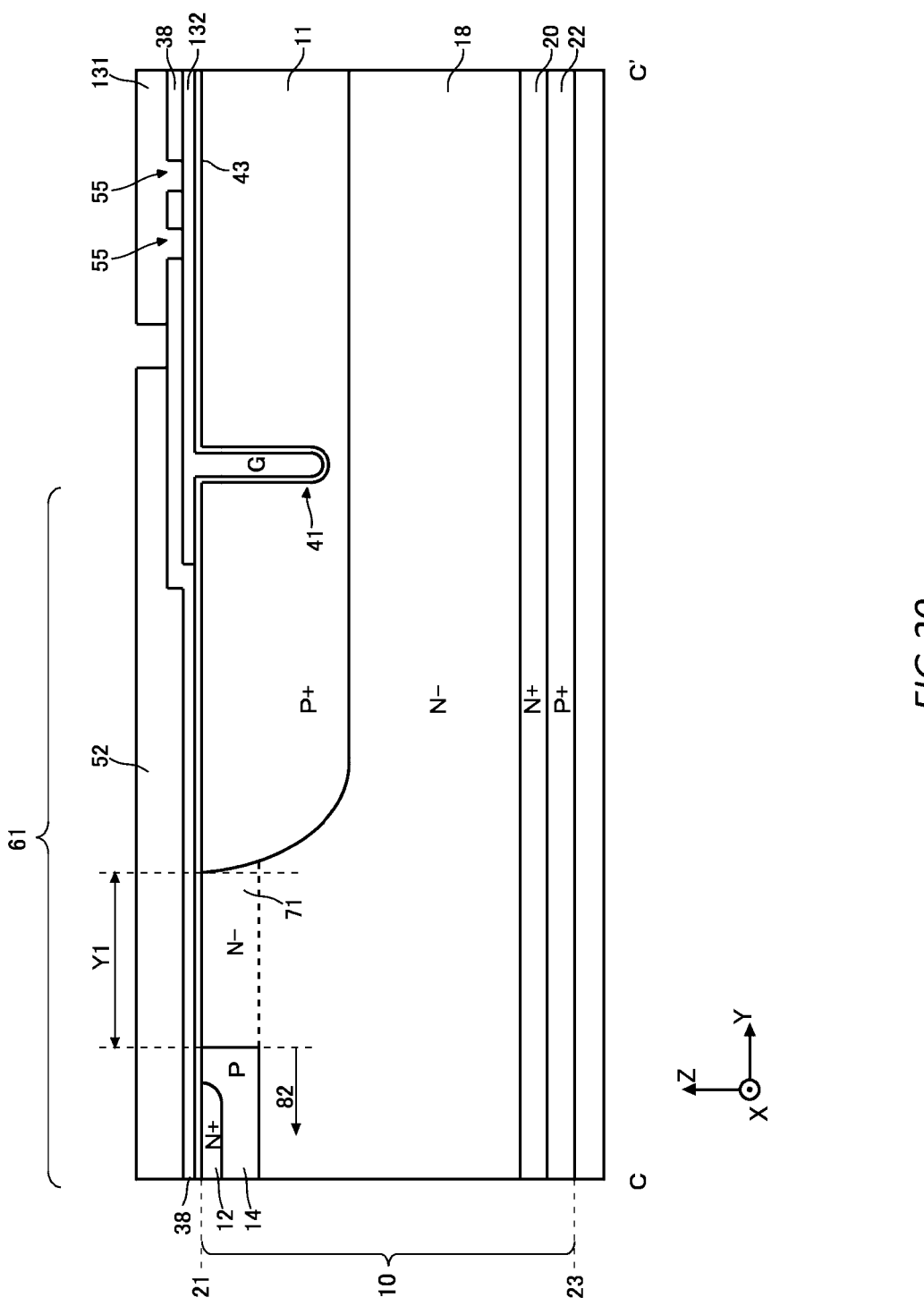
FIG. 20 is a view illustrating an example of a C-C' cross section in FIG. 19.

FIG. 20 is a view illustrating an example of a C-C' cross section in FIG. 19. The structure of the semiconductor device 100 of this example is the same as the structure described in FIG. 7 except that the first region 71 is provided instead of the connection trench portion 70. The first region 71 is insulated from the emitter electrode 52 by the interlayer dielectric film 38.

By providing the first region 71 at a position not over-lapping with the well region 11, at least partial region 82 of the floating mesa portion 61 can be separated from the well region 11. The first region 71 may be formed from the upper surface 21 of the semiconductor substrate 10 to a position shallower than the lower end of the well region 11 or may be formed to a deep position. The first region 71 may be formed to the same depth as the gate trench portion 40, or may be formed to be shallower than the gate trench portion 40. The first region 71 is preferably formed to be the same as or deeper than the base region 14. The first region 71 may be formed to a depth reaching the drift region 18. The first region 71 of this example has the same doping concentration as that of the drift region 18, but the doping concentration of the first region 71 may be higher or lower than that of the drift region 18. When the accumulation region 16 is pro-vided below the base region 14, the accumulation region 16 may also be provided below the first region 71. The first region 71 may have the same doping concentration as that of the accumulation region 16, and may have a higher or lower doping concentration than that of the accumulation region 16.

The first region 71 forms a PN junction with at least one of the base region 14 or the well region 11. The length of the first region 71 in the Y axis direction is defined as Y1. The first region 71 preferably has a length Y1 which allows at least partial region in the Y axis direction to remain without being depleted. In addition, when the length Y1 is exces-sively large, the region 82 becomes small. The length Y1 is, for example, 1 μm or more and 5 μm or less. The length Y1 may be 1.5 μm or more, or 2 μm or more. The length Y1 may be 4.5 μm or less, or 4 μm or less.

Figure 21:
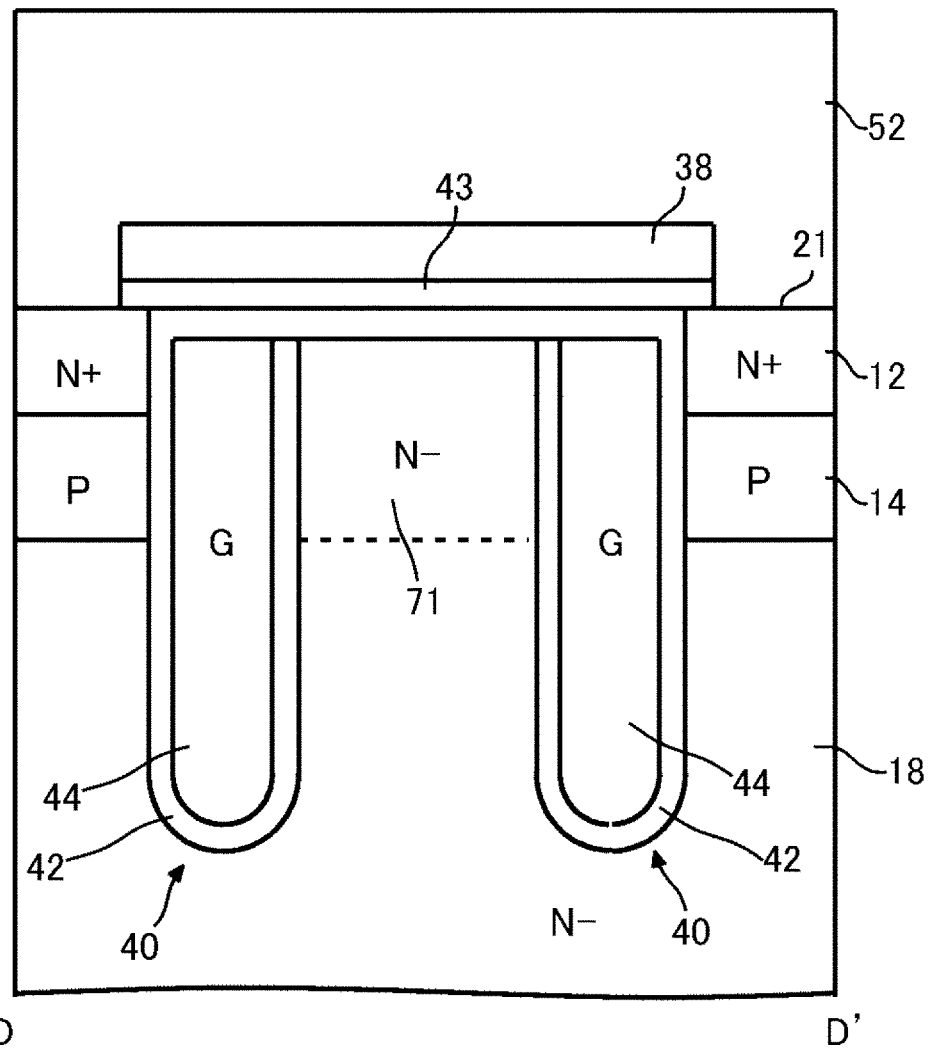
FIG. 21 is a view illustrating an example of a D-D' cross section in FIG. 19.
Figure 21:
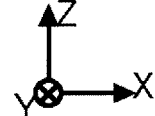

FIG. 21 is a view illustrating an example of a D-D' cross section in FIG. 19. The structure of the semiconductor device 100 of this example is the same as the structure described in FIG. 8 except that the first region 71 is provided instead of the connection trench portion 70. However, in the example of FIG. 21, the semiconductor device 100 does not have the accumulation region 16. In this example, the drift region 18 may be provided up to the upper surface 21 of the semiconductor substrate 10 in the mesa portion. That is, in the mesa portion where the first region 71 is provided, a region of the P type does not exist between the first region 71 and the drift region 18. As a result, the well region 11 and the base region 14 of the mesa portion can be separated.

Figure 22:
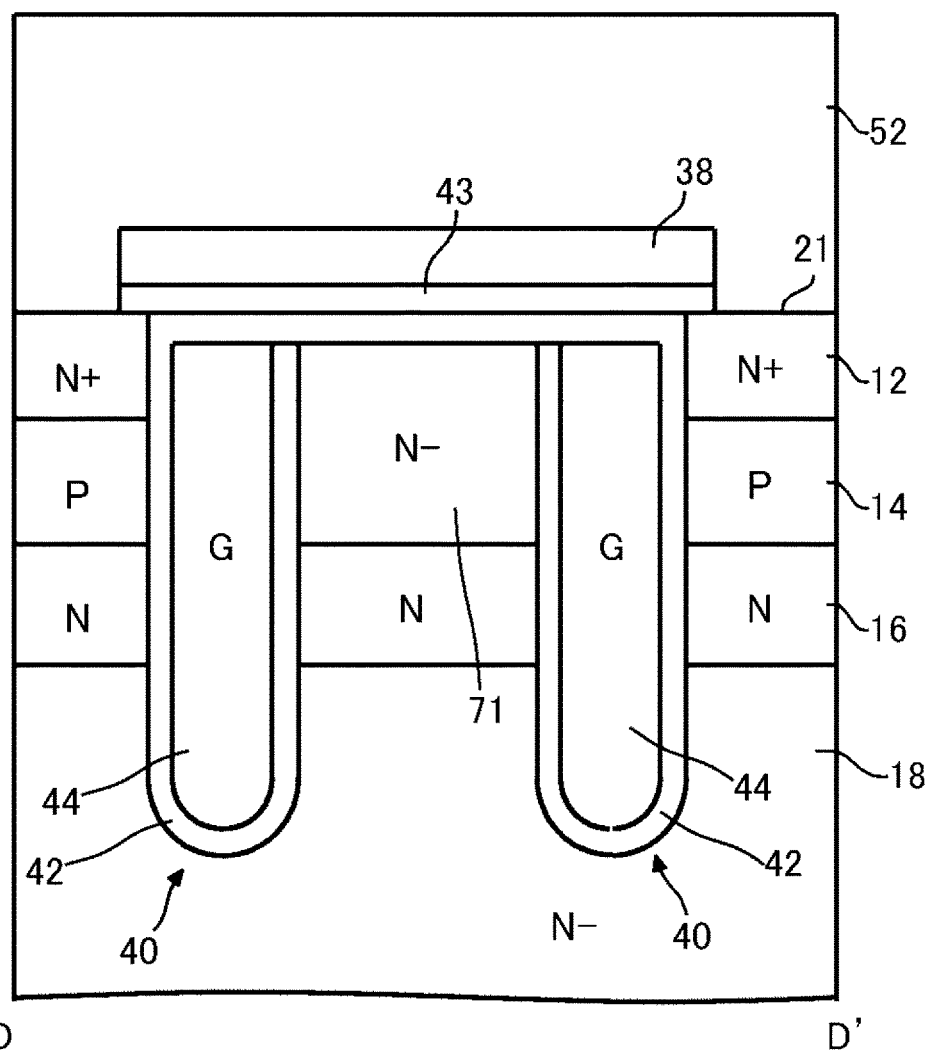
FIG. 22 is a view illustrating another example of the D-D' cross section in FIG. 19.
Figure 22:
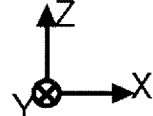

FIG. 22 is a view illustrating another example of the D-D' cross section in FIG. 19. The structure of the semiconductor device 100 of this example is the same as the structure described in FIG. 21 except that the accumulation region 16 is provided. The first region 71 is provided from the upper surface 21 of the semiconductor substrate 10 to the accu-mulation region 16. The drift region 18 is provided below the accumulation region 16. Also in this example, in the mesa portion where the first region 71 is provided, a region of the P type does not exist between the first region 71 and the drift region 18. Even with such a structure, the well region 11 and the base region 14 of the mesa portion can be separated.

Figure 23:
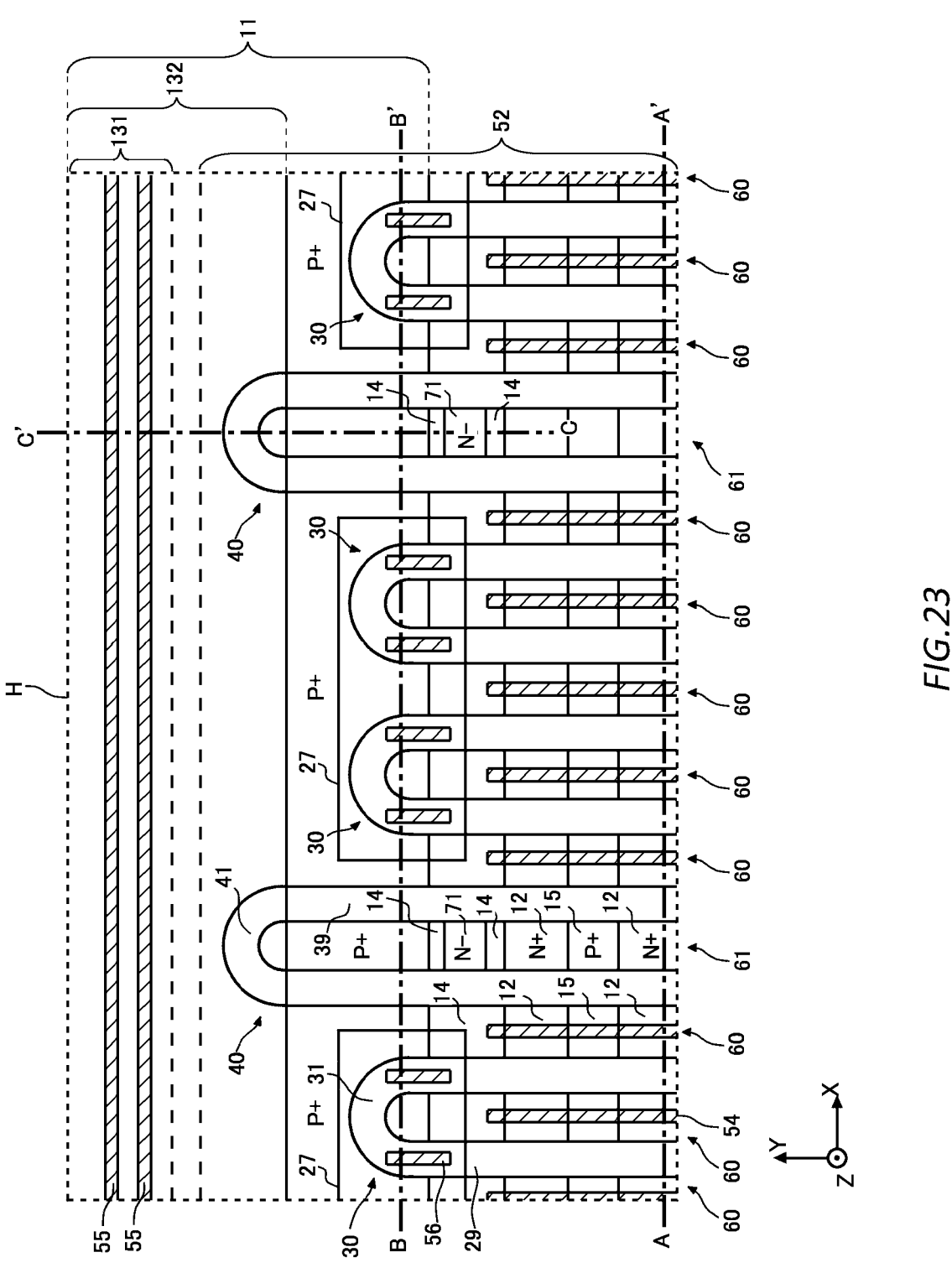
FIG. 23 is a view illustrating another example of the region H.

FIG. 23 is a view illustrating another example of the region H. The semiconductor device 100 of this example is different from those of the examples described in FIGS. 19 to 22 in that the first region 71 is arranged away from the well region 11. Other structures are similar to any of the aspects described in FIGS. 19 to 22. Even with such a structure, the well region 11 and at least a part of the mesa portion can be separated.

Figure 24:
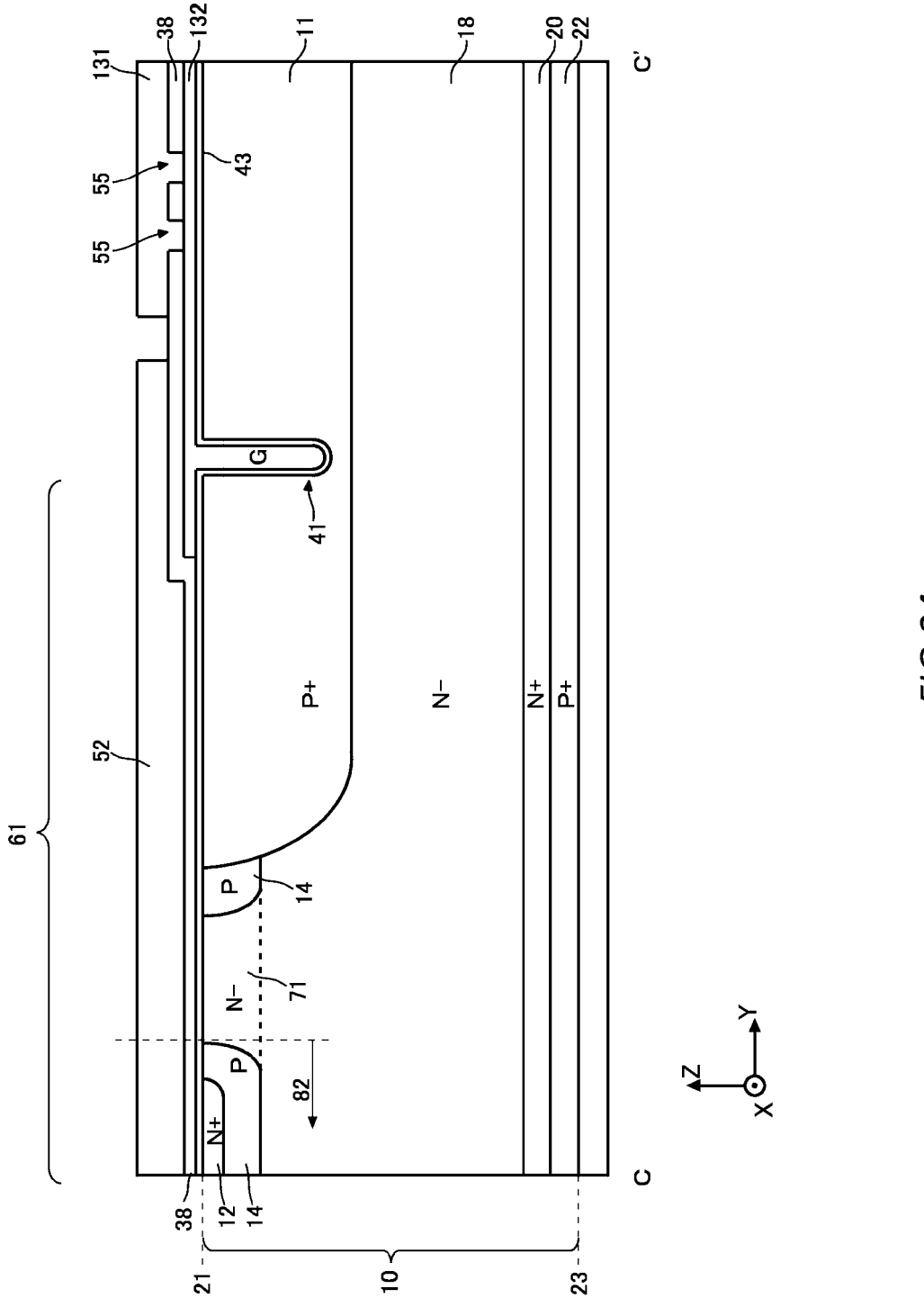
FIG. 24 is a view illustrating an example of a C-C' cross section in FIG. 23.

FIG. 24 is a view illustrating an example of a C-C' cross section in FIG. 23. The semiconductor device 100 of this example is different from that of the example described in FIG. 20 in that the first region 71 is arranged away from the well region 11. Other structures are similar to those of the example described in FIG. 20. The base region 14 may be arranged between the first region 71 and the well region 11. Even with such a structure, the well region 11 and the region 82 can be separated.

Figure 25:
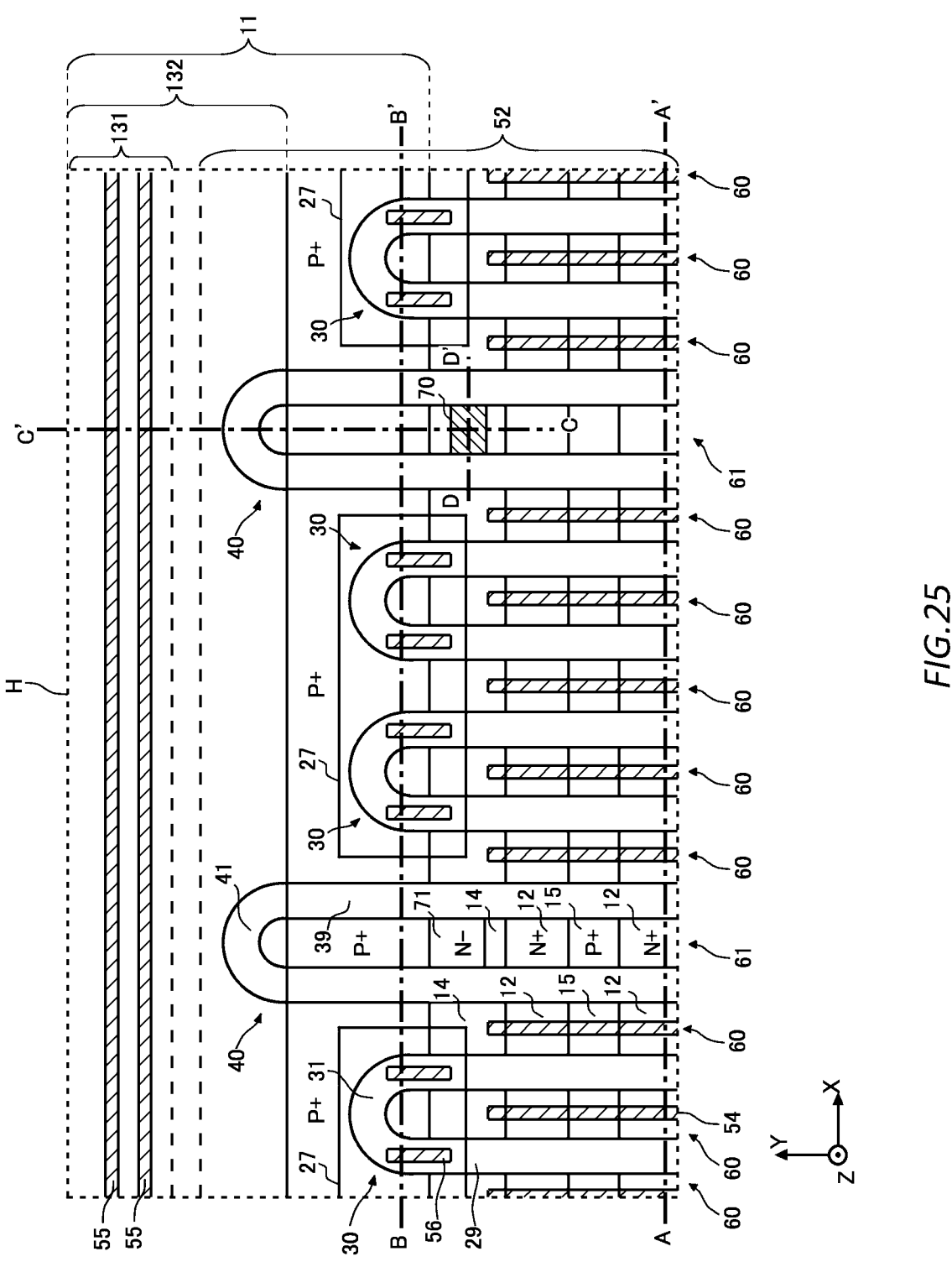
FIG. 25 is a view illustrating another example of the region H.

FIG. 25 is a view illustrating another example of the region H. The semiconductor device 100 of this example is different from those of the examples described in FIGS. 1 to 24 in including both the connection trench portion 70 and the first region 71. Other structures are similar to any of the examples described in FIGS. 1 to 24. The structure and arrangement of the connection trench portion 70 and the first region 71 are similar to any of the examples described in FIGS. 6 to 24.

In this example, the separation portion of at least one mesa portion is the connection trench portion 70, and the separation portion of the other at least one mesa portion is the first region 71. The connection trench portion 70 and the first region 71 may be arranged in a mesa portion adjacent to each other in the X axis direction, or may be arranged in a mesa portion away from each other. In the example of FIG. 25, the connection trench portion 70 is provided in one of two floating mesa portions 61 arranged apart from each other in the X axis direction, and the first region 71 is provided in the other floating mesa portion. Since the connection trench portion 70 is not depleted unlike the first region 71, the length of the connection trench portion 70 in the Y axis direction may be smaller than the length of the first region 71 in the Y axis direction. Even with such a structure, the well region 11 and the mesa portion can be separated.

Figure 26:
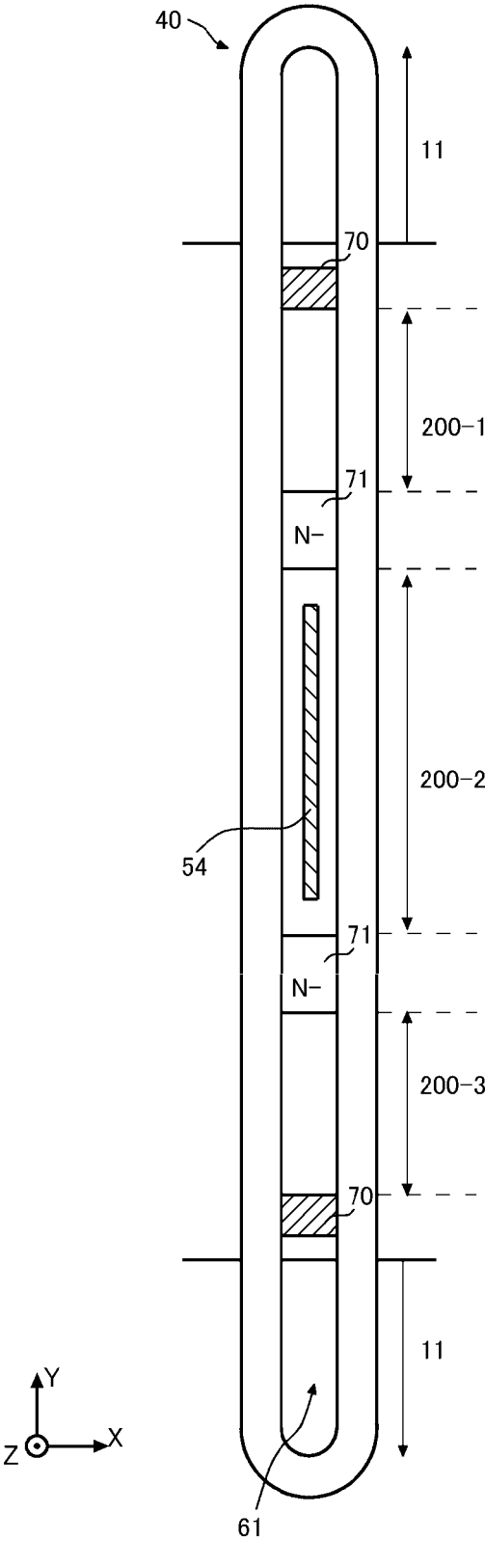
FIG. 26 is a view illustrating an arrangement example of a plurality of separation portions in one mesa portion.

FIG. 26 is a view illustrating an arrangement example of a plurality of separation portions in one mesa portion. The semiconductor device 100 of this example is different from those of the examples described in FIGS. 1 to 24 in including both the connection trench portion 70 and the first region 71. Other structures are similar to any of the examples described in FIGS. 1 to 24. The structure and arrangement of the connection trench portion 70 and the first region 71 are similar to any of the examples described in FIGS. 6 to 24.

In this example, the connection trench portion 70 and the first region 71 are provided in one mesa portion. The length of the connection trench portion 70 in the Y axis direction may be smaller than the length of the first region 71 in the Y axis direction. The connection trench portion 70 may be arranged closer to the well region 11 than the first region 71. In the example of FIG. 26, among the plurality of connection trench portions 70 described in FIG. 17, the connection trench portions 70 other than the connection trench portions 70 arranged at both ends in the Y axis direction are replaced with the first regions 71. Other structures are similar to those of the example described in FIG. 17. Even with such a structure, the well region 11 and the mesa portion can be separated. When there is a trench arranged perpendicularly to a bonding direction in a bonding portion of a bonding wire at the time of assembly, there is a risk that mechanical damage is applied. When the connection portion of the chip active portion to which the bonding wire is bonded is set to the first region 71 instead of the connection trench portion 70, it is possible to reduce the risk of mechanical damage.

In another example, the first region 71 may be arranged closer to the well region 11 than the connection trench portion 70. For example, among the plurality of connection trench portions 70 described in FIG. 17, the connection trench portions 70 arranged at both ends in the Y axis direction may be replaced with the first regions 71. Even with such a structure, the well region 11 and the mesa portion can be separated.

Figure 27:
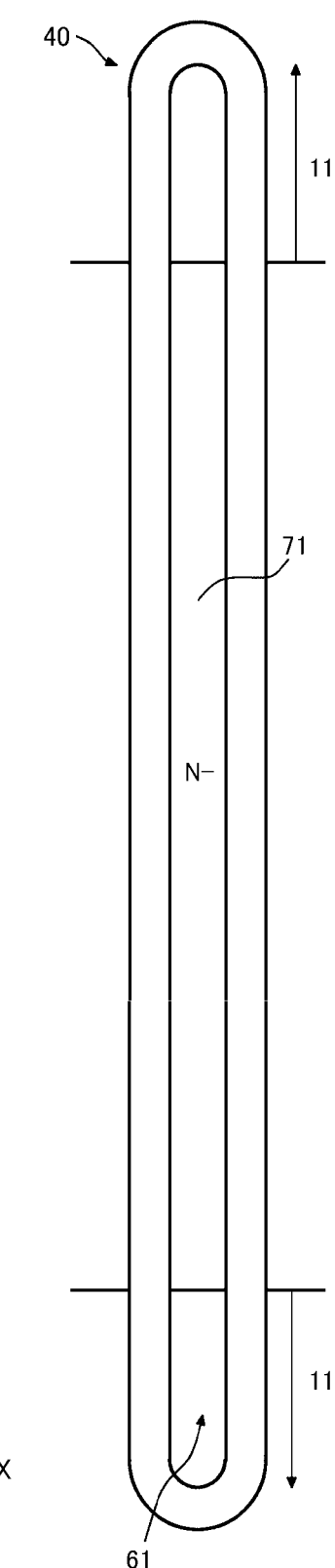
FIG. 27 is a view illustrating an arrangement example of a first region 71 in one mesa portion.

FIG. 27 is a view illustrating an arrangement example of the first region 71 in one mesa portion. The semiconductor device 100 of this example has the first region 71 in at least one of the floating mesa portion 61 or the emitter-connected mesa portion 60. In addition, both ends of the first region 71 in the Y axis direction are connected to the well region 11. That is, the entire mesa portion is the first region 71 in the top view. The mesa portion is not provided with a region of the P type also in the depth direction. Even with such a structure, the mesa portion can be separated from the well region 11. Note that as illustrated in FIG. 2 or the like, the dummy trench portion 30 is provided outside the gate trench portion 40 to be adjacent to the gate trench portion 40. By setting the entire mesa portion to the first region 71, uniform operation of the mesa portion can be reliably realized.

While the present invention has been described by way of the embodiments, the technical scope of the present invention is not limited to the above described embodiments. It is apparent to persons skilled in the art that various alterations or improvements can be made to the above described embodiments. It is also apparent from the description of the claims that embodiments added with such alterations or improvements can be included in the technical scope of the present invention.

The operations, procedures, steps, and stages of each process performed by a device, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor device comprising:
   a semiconductor substrate having an upper surface and a lower surface and provided with a drift region of a first conductivity type;
   an emitter electrode arranged above the upper surface of the semiconductor substrate;
   a plurality of trench portions which are provided from the upper surface of the semiconductor substrate to an inside of the semiconductor substrate, have a long side in a first direction on the upper surface of the semiconductor substrate, and are arranged side by side in a second direction different from the first direction;
   a well region of a second conductivity type which is provided between the drift region and the upper surface in the semiconductor substrate and is arranged to overlap end portions of the plurality of trench portions in the first direction in a top view; and
   a plurality of mesa portions which are arranged one by one between two of the trench portions adjacent to each other in the second direction in the semiconductor substrate, wherein the plurality of mesa portions includes
   a floating mesa portion which is insulated from the emitter electrode, and
   an emitter-connected mesa portion which is arranged adjacent to the floating mesa portion in the second direction and is connected to the emitter electrode, and
   at least one of the floating mesa portion or the emitter-connected mesa portion has a separation portion which separates the well region from at least a part of the mesa portion, and the separation portion is provided in a portion provided at a position not overlapping the well region in the top view to connect two of the trench portions sandwiching the mesa portion.

2. The semiconductor device according to claim 1, wherein
   the well region is provided to be deeper than a lower end of the trench portion.

3. The semiconductor device according to claim 1, wherein
   the plurality of trench portions include two or more gate trench portions to which a gate voltage is applied, and
   the separation portion is provided in the mesa portion sandwiched between two of the gate trench portions.

4. The semiconductor device according to claim 3, wherein
   the separation portion is provided in the floating mesa portion sandwiched between two of the gate trench portions.

5. The semiconductor device according to claim 3, wherein
   the gate trench portion has a gate conductive portion to which the gate voltage is applied, and
   the separation portion is a connection trench portion having a connection conductive portion connected to the gate conductive portion.

6. The semiconductor device according to claim 5, wherein
   at least one of the connection trench portions is connected to three or more of the trench portions arranged in the second direction.

7. The semiconductor device according to claim 5, wherein
   the connection trench portion is provided to a same depth as the trench portion.

8. The semiconductor device according to claim 5, wherein
   the connection trench portion is provided to be shallower than the trench portion.

9. The semiconductor device according to claim 3, wherein
   the gate trench portion includes a gate conductive portion to which the gate voltage is applied,
   the separation portion is provided in each of two or more of the mesa portions,
   the mesa portion provided with the separation portion has a base region of a second conductivity type,
   the separation portion of at least one of the mesa portions is a connection trench portion having a connection conductive portion connected to the gate conductive portion, and
   the separation portion of at least one of the mesa portions is a first region of a first conductivity type which is provided between the well region and at least a part of the base region to separate the well region from the at least a part of the base region.

10. The semiconductor device according to claim 3, wherein

US 12,641,858 B2

21 the gate trench portion includes a gate conductive portion to which the gate voltage is applied, a plurality of the separation portions are provided in at least one of the mesa portions, the mesa portion provided with the separation portion has a base region of a second conductivity type, at least one of the separation portions is a connection trench portion having a connection conductive portion connected to the gate conductive portion, and at least one of the separation portions is a first region of a first conductivity type which is provided between the well region and at least a part of the base region to separate the well region from the at least a part of the base region.

11. The semiconductor device according to claim 10, wherein the connection trench portion is arranged closer to the well region than the first region.

12. The semiconductor device according to claim 3, wherein the plurality of trench portions further include a dummy trench portion adjacent to the gate trench portion.

13. The semiconductor device according to claim 1, wherein the mesa portion provided with the separation portion has a base region of a second conductivity type, and the separation portion is a first region of a first conductivity type which is provided between the well region and at least a part of the base region to separate the well region from the at least a part of the base region.

14. The semiconductor device according to claim 13, wherein the first region is provided from the upper surface of the semiconductor substrate to the drift region.

15. The semiconductor device according to claim 13, wherein a length of the first region in the first direction is 1 μm or more and 5 μm or less.

16. The semiconductor device according to claim 1, wherein the mesa portion is provided on the semiconductor substrate, is connected to the emitter electrode, and has a plurality of emitter regions of a first conductivity type, each having a higher concentration than that of the drift region, and the separation portion is arranged between an emitter region, which is located closest to an end of the plurality of trench portions in the first direction among the plurality of emitter regions, and the well region.

17. The semiconductor device according to claim 16, wherein a plurality of the separation portions are provided between the emitter region, which is located closest to the end of the plurality of trench portions in the first direction, and the well region.

18. The semiconductor device according to claim 1, wherein the separation portion is in contact with the well region.

19. The semiconductor device according to claim 1, wherein in any of the mesa portions, two of the separation portions are arranged at different positions in the first direction.

20. The semiconductor device according to claim 1, wherein any of the mesa portions is divided into a plurality of partial regions in the first direction by the separation portion, any of the partial regions is connected to the emitter electrode, and any other of the partial regions is not connected to the emitter electrode.

21. The semiconductor device according to claim 1, wherein each of the mesa portions includes a base region of a second conductivity type which is arranged between the drift region and the upper surface of the semiconductor substrate, and an accumulation region of a first conductivity type which is arranged between the base region and the drift region and has a higher concentration than that of the drift region.

* * * * *